United States Patent
Silberman et al.

(10) Patent No.: US 12,191,888 B2
(45) Date of Patent: Jan. 7, 2025

(54) SYSTEMS AND METHODS FOR COMPRESSING AND STORING SENSOR DATA COLLECTED BY AN AUTONOMOUS VEHICLE

(71) Applicant: Aurora Operations, Inc., Pittsburgh, PA (US)

(72) Inventors: Joshua Oren Silberman, San Francisco, CA (US); Dillon Collins, Pittsburgh, PA (US)

(73) Assignee: AURORA OPERATIONS, INC., Pittsburgh, PA (US)

( * ) Notice: Subject to any disclaimer, the term of this patent is extended or adjusted under 35 U.S.C. 154(b) by 348 days.

(21) Appl. No.: 17/139,440

(22) Filed: Dec. 31, 2020

(65) Prior Publication Data

US 2022/0116052 A1 Apr. 14, 2022

Related U.S. Application Data

(60) Provisional application No. 63/090,536, filed on Oct. 12, 2020.

(51) Int. Cl.
*H03M 7/30* (2006.01)
*B60W 50/00* (2006.01)
(Continued)

(52) U.S. Cl.
CPC .......... *H03M 7/3059* (2013.01); *B60W 50/00* (2013.01); *G05D 1/0088* (2013.01);
(Continued)

(58) Field of Classification Search
CPC ............... H03M 7/3059; B60W 50/00; B60W 2050/0043; G05D 1/0088;
(Continued)

(56) References Cited

U.S. PATENT DOCUMENTS

2013/0063597 A1* 3/2013 Wender ................ H04N 19/521
348/148
2018/0188427 A1* 7/2018 Brueckner ............. G02B 5/201
(Continued)

OTHER PUBLICATIONS

T. Chang, B. Tolooshams and D. Ba, "Randnet: Deep Learning with Compressed Measurements of Images," 2019 IEEE 29th International Workshop on Machine Learning for Signal Processing (MLSP), Pittsburgh, PA, USA, 2019, pp. 1-6, doi: 10.1109/MLSP.2019. 8918878. (Year: 2019).*

*Primary Examiner* — Elaine Gort
*Assistant Examiner* — Ellis B. Ramirez
(74) *Attorney, Agent, or Firm* — Dority & Manning, P.A.

(57) ABSTRACT

A vehicle computing system onboard an autonomous vehicle can include one or more processors and one or more non-transitory computer-readable media that store instructions that, when executed by the one or more processors, cause the computing system to perform operations. The operations can include obtaining sensor data from one or more sensors of the autonomous vehicle; applying lossy compression to the sensor data to generate compressed sensor data; storing data describing the compressed sensor data; decompressing the compressed sensor data to generate decompressed sensor data; and inputting data describing the decompressed sensor data into an autonomy system comprising one or more machine-learned models. The autonomy system can be configured to control operations of the autonomous vehicle based on the decompressed sensor data.

21 Claims, 7 Drawing Sheets

(51) Int. Cl.
  *G05D 1/00*     (2024.01)
  *G06N 20/00*    (2019.01)
  *G07C 5/08*     (2006.01)
  *H03K 19/173*   (2006.01)

(52) U.S. Cl.
  CPC ............ *G06N 20/00* (2019.01); *G07C 5/085* (2013.01); *H03K 19/173* (2013.01); *B60W 2050/0043* (2013.01)

(58) Field of Classification Search
  CPC ........... G05D 2201/0213; G06N 20/00; G07C 5/085; G07C 5/0841; H03K 19/173
  USPC ............ 701/23, 540; 710/68; 382/243, 244; 348/14.13, 568
  See application file for complete search history.

(56) References Cited

U.S. PATENT DOCUMENTS

| | | | |
|---|---|---|---|
| 2018/0192059 A1* | 7/2018 | Yang | G06V 20/584 |
| 2019/0174514 A1* | 6/2019 | Ramesh | G08G 1/202 |
| 2019/0250622 A1* | 8/2019 | Nister | G06V 20/584 |
| 2019/0287024 A1* | 9/2019 | Briggs | G05D 1/0088 |
| 2019/0302766 A1* | 10/2019 | Mondello | G05D 1/0246 |
| 2020/0065711 A1* | 2/2020 | Clément | B60W 40/10 |
| 2021/0241166 A1* | 8/2021 | Horesh | G06F 21/602 |
| 2022/0294467 A1* | 9/2022 | Strigel | H03M 7/6005 |

* cited by examiner

SYSTEMS AND METHODS FOR COMPRESSING AND STORING SENSOR DATA COLLECTED BY AN AUTONOMOUS VEHICLE

CROSS-REFERENCE TO RELATED APPLICATION

The present application claims filing benefit of U.S. Provisional Patent Application Ser. No. 63/090,536 having a filing date of Oct. 12, 2020, which is incorporated herein by reference in its entirety.

FIELD

The present disclosure relates generally to autonomous vehicles. More particularly, the present disclosure relates to systems and methods for compressing and storing sensor data collected by an autonomous vehicle.

BACKGROUND

An autonomous vehicle can be capable of sensing its environment and navigating with little to no human input. In particular, an autonomous vehicle can observe its surrounding environment using a variety of sensors and can attempt to comprehend the environment by performing various processing techniques on data collected by the sensors. Given knowledge of its surrounding environment, the autonomous vehicle can navigate through such surrounding environment.

SUMMARY

Aspects and advantages of embodiments of the present disclosure will be set forth in part in the following description, or can be learned from the description, or can be learned through practice of the embodiments.

Aspects of the present disclosure are directed to a computing system onboard an autonomous vehicle. The vehicle computing system can include one or more processors and one or more non-transitory computer-readable media that store instructions that, when executed by the one or more processors, cause the computing system to perform operations. The operations can include obtaining sensor data from one or more sensors of the autonomous vehicle; applying lossy compression to the sensor data to generate compressed sensor data; storing data describing the compressed sensor data; decompressing the compressed sensor data to generate decompressed sensor data; and inputting data describing the decompressed sensor data into an autonomy system comprising one or more machine-learned models. The autonomy system can be configured to control operations of the autonomous vehicle based on the decompressed sensor data.

Another aspect of the present disclosure is directed to a method for compressing and storing sensor data collected by an autonomous vehicle. The method can include obtaining, by a vehicle computing system comprising one or more computing devices onboard the autonomous vehicle, sensor data from by one or more sensors of the autonomous vehicle; applying, by the vehicle computing system, lossy compression to the sensor data to generate compressed sensor data; storing, by the vehicle computing system, data describing the compressed sensor data; decompressing, by the vehicle computing system, the compressed sensor data to generate decompressed sensor data; and inputting, by the vehicle computing system, data describing the decompressed sensor data into an autonomy system comprising one or more machine-learned models, the autonomy system configured to control operations of the autonomous vehicle based on the decompressed sensor data.

Another aspect of the present disclosure is directed to a vehicle computing system including a vehicle computing system comprising one or more processors and one or more non-transitory computer-readable media that store instructions that, when executed by the one or more processors, cause the vehicle computing system to perform operations. The operations can include obtaining sensor data from by one or more sensors of the autonomous vehicle; applying lossy compression to the sensor data to generate compressed sensor data; storing data describing the compressed sensor data; decompressing the compressed sensor data to generate decompressed sensor data. The computing system can include a training computing system comprising one or more processors and one or more non-transitory computer-readable media that store instructions that, when executed by the one or more processors, cause the training computing system to perform operations. The operations can include receiving the compressed sensor data from the vehicle computing system and training one or more machine-learned models based on the compressed sensor data.

Other aspects of the present disclosure are directed to various systems, apparatuses, non-transitory computer-readable media, user interfaces, and electronic devices.

The autonomous vehicle technology described herein can help improve the safety of passengers of an autonomous vehicle, improve the safety of the surroundings of the autonomous vehicle, improve the experience of the rider and/or operator of the autonomous vehicle, as well as provide other improvements as described herein. Moreover, the autonomous vehicle technology of the present disclosure can help improve the ability of an autonomous vehicle to effectively provide vehicle services to others and support the various members of the community in which the autonomous vehicle is operating, including persons with reduced mobility and/or persons that are underserved by other transportation options. Additionally, the autonomous vehicle of the present disclosure may reduce traffic congestion in communities as well as provide alternate forms of transportation that may provide environmental benefits.

These and other features, aspects, and advantages of various embodiments of the present disclosure will become better understood with reference to the following description and appended claims. The accompanying drawings, which are incorporated in and constitute a part of this specification, illustrate example embodiments of the present disclosure and, together with the description, serve to explain the related principles.

BRIEF DESCRIPTION OF THE DRAWINGS

Detailed discussion of embodiments directed to one of ordinary skill in the art is set forth in the specification, which makes reference to the appended figures, in which.

DETAILED DESCRIPTION

Figure 1:
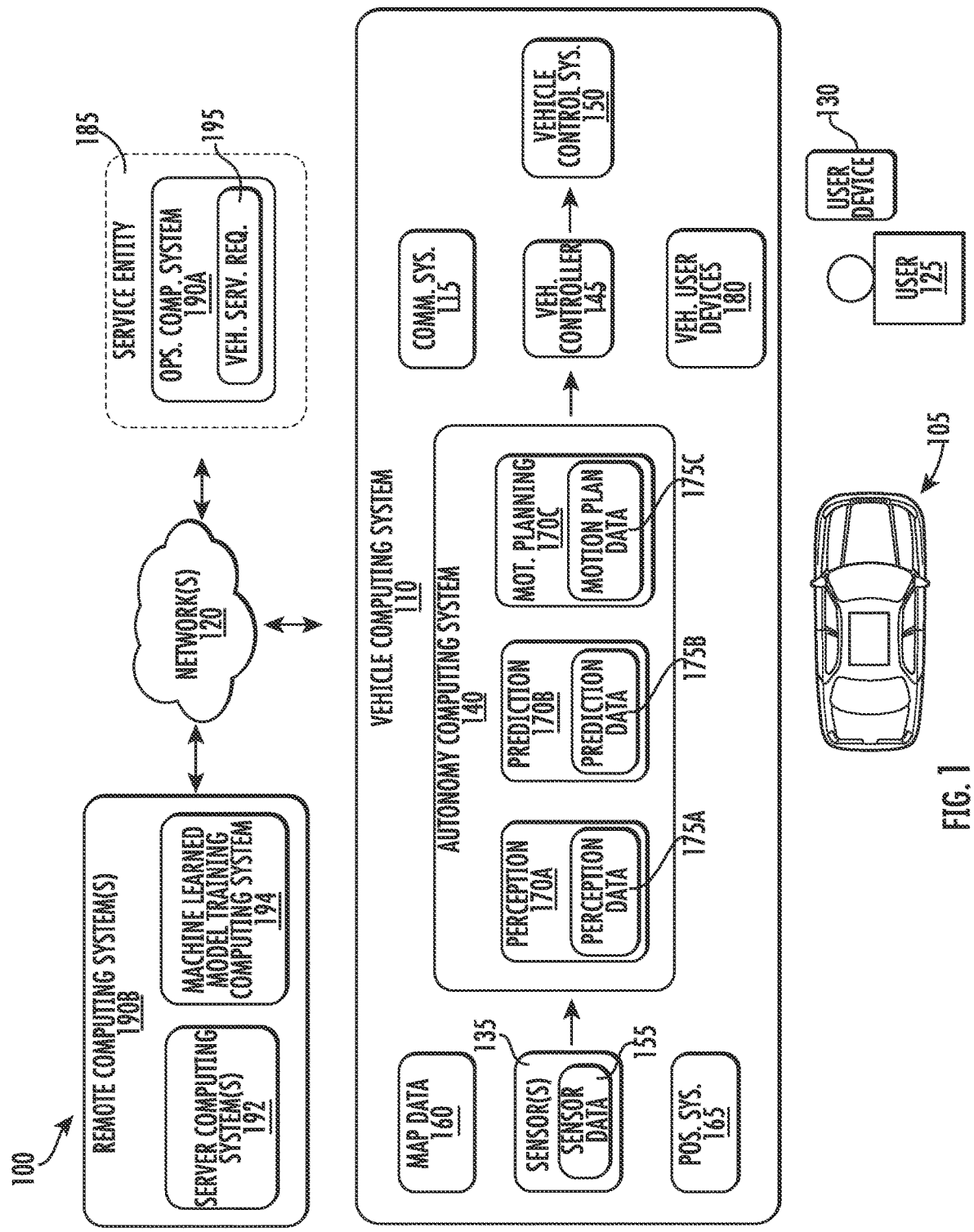
FIG. 1 depicts an example system overview according to example implementations of the present disclosure.

Generally, the present disclosure is directed to systems and methods for compressing and storing sensor data collected by an autonomous vehicle. Autonomous vehicles collect a large volume of sensor data from an array of sensors as they navigate. Storing or logging this sensor data is desirable for a variety of reasons. As one example, logged sensor data can be used to train machine-learned models to improve operations of the autonomous vehicle. For example, the logged sensor data can be used to train machine-learned models to recognize objects, anticipate actions of other actors, and/or control one or more operations of the autonomous vehicle. As another example, logged sensor data can be used to review and/or analyze instances where the autonomous vehicle did not operate as desired. Logging such sensor data in an uncompressed or losslessly compressed form, however, requires a substantial amount of storage space. Memory storage devices onboard the vehicle that are available for storing such data can become full within a relatively short time frame, such as a matter of hours of normal operation of the autonomous vehicle. Operation of the autonomous vehicle can be significantly hindered by frequently stopping to download the sensor data, for example, at a vehicle service station. Storage of sensor data off board the autonomous vehicle (e.g., a server computing system) likewise consumes valuable resources.

According to aspects of the present disclosure, sensor data can be compressed using a lossy compression algorithm and then stored onboard the autonomous vehicle for later off-loading. The compressed data can be decompressed and processed as usual by the vehicle computing system (e.g., an autonomy computing sub-system, etc.) to operate the vehicle. Thus, the sensor data can be compressed and decompressed during the data processing flow of the autonomous vehicle. This configuration is generally contrary to conventional knowledge and wisdom regarding processing sensor data onboard autonomous vehicles as lossy compression reduces image quality. Rather, achieving very low latency processing of sensor data onboard the autonomous vehicle is generally an important goal that prohibits processing that is not strictly necessary to operation of the vehicle. Adding compression and subsequent decompression processing prior to inputting the sensor data into the autonomy system increases the latency of the system. Further, this compression and decompression would generally not be considered necessary and may be detrimental to the subsequent processing by the vehicle computing system (e.g., the autonomy system) for controlling the autonomous vehicle. Thus, performing compression and decompression as described herein would generally be considered an unexpected or unconventional method for reducing the size of logged sensor data. Nevertheless, aspects of the present disclosure are directed to such pre-processing of sensor data as other benefits (as described herein) have been found to outweigh a small increase in latency resulting from this pre-processing. Example benefits include providing for greater use of compressed data for training of models (e.g., machine learned models). The models can also be tested using the same data that was used to train models. For example, offline simulations can be conducted in which the models can be used to process the same data that models process onboard autonomous vehicle during normal operation. Such offline simulations can more accurately predict how the model will process data when onboard the autonomous vehicle during normal operation. This capability can be particularly useful for testing new model architectures, types, training techniques, and the like.

An autonomous vehicle can be a variety of types of vehicles. This can include, for example, a ground-based autonomous vehicle, truck, etc. and/or other types of vehicles (e.g., aerial, watercraft, light electric vehicle). An autonomous vehicle can include an onboard vehicle computing system (e.g., located on and/or within the vehicle). The vehicle computing system can include a variety of components for operating with minimal and/or no interaction from a human operator. For example, the vehicle computing system can be located onboard the autonomous vehicle and include one or more sensors (e.g., cameras, LIDAR, Radio Detection and Ranging (RADAR), etc.), an autonomy computing system (e.g., for determining autonomous navigation), one or more vehicle control systems (e.g., for controlling braking, steering, powertrain), etc.

The vehicle computing system (e.g., the autonomy computing system) can include sub-systems that cooperate to perceive the surrounding environment of the autonomous vehicle and determine a motion plan for controlling the motion of the autonomous vehicle. For example, the vehicle computing system can include a joint perception and prediction system configured to perceive object(s) within the surrounding environment of the autonomous vehicle and to predict motion of the object(s) within the surrounding environment of the autonomous vehicle. In some implementations, the vehicle computing system can separate these perception and prediction functions into separate systems. The vehicle computing system can include a motion planning system configured to plan the motion of the autonomous vehicle with respect to the object(s) within the surrounding environment of the autonomous vehicle.

A vehicle computing system can be configured to obtain sensor data generated by one or more sensors of the autonomous vehicle. For example, the sensor data can be or include image data from a camera, LIDAR data from a LIDAR sensor, radar from a radar sensor, or any other suitable sensor data generated by sensors onboard autonomous vehicles. A lossy compression algorithm can be applied to the sensor data to generate compressed sensor data. The lossy compression algorithm can be or include a variety of algorithms, codecs, or the like. As one example, a block-oriented integer-discrete cosine transform algorithm, can be employed. The H264 compression codec is one example of such an algorithm. The compressed sensor data can be locally stored by the vehicle computing system, for example in memory that is onboard the autonomous vehicle. The vehicle computing system can decompress the sensor data and input data describing the decompressed sensor data into the autonomy system of the autonomous vehicle. The autonomy system can include one or more machine-learned models and can be configured to control operations of the autonomous vehicle based on the data describing the decompressed sensor data. Thus, the sensor data can be compressed and decompressed onboard the autonomous vehicle prior to being input into the autonomy system.

In some embodiments, the sensor data can include image data, such as two-dimensional image data (e.g., captured from a camera onboard the autonomous vehicle). One example type of image data is raw Bayer data. The image data can be collected and/or generated in a variety of formats, resolutions, and the like. However, aspects of the present disclosure can apply to a variety of other types of sensor data, such as LIDAR point data, sonar data, radar data, infrared sensor data, and the like.

Generally, minimal processing, if any, is applied to the sensor data before it is compressed. For example, before applying the lossy compression to the sensor data, the vehicle computing system can scale, re-size (e.g., downsize), or otherwise adjust the sensor data. In one example embodiment, the vehicle computing system can convert the sensor data into a non-linear space (e.g., from a linear space). For instance, the raw image data can be generated (e.g., by the camera) in a linear color space and converted into a non-linear color space before compression is applied. Storing image data in a non-linear color space can provide several advantages over a linear color space. As one example, machine-learned models can generally be more effectively trained and utilized with image data defined in a non-linear color space. Non-linear mapping can be used to allocate fewer data bits to very bright areas of the image data that linear mapping allocates more data bits to very dark areas of the image data. This allocation or mapping may add noise in a manner that correlates with noise that is expected to already be present in the sensor data (e.g., as produced by the sensor). Thus, in some embodiments, some processing of the image data can be performed prior to compression of the image data.

In some embodiments, the vehicle computing system can apply a lossy compression algorithm to individual image frames of the sensor data without applying motion-based compression to the image. Motion-based compression can reduce the size of the image data based on how humans perceive movement as represented in a series of image frames. Generally, such motion-based compression is avoided as it can negatively affect the use and/or training of machine-learned models with the data. However, in some embodiments motion-based compression can be employed, for example if such compression has been found to not adversely affect (or minimally affect) operation and/or training of the autonomy system (e.g., the machine-learned model(s) of the autonomy system) in particular scenarios. Thus, generally, lossy compression can be applied to individual image frames of the sensor data without applying motion-based compression to the image.

In some embodiments, the vehicle computing system can include a field programmable gate array (FPGA). The vehicle computing system can apply the lossy compression to the sensor data using the field programmable gate array. Field programmable gate arrays can be particularly useful for processing data with low latency. For instance, the sensor data can be processed as a continuous stream of data points, in contrast to completing a stage of processing (e.g., compression) of a particular image before starting to process the next image or beginning a subsequent stage of processing for that particular image (e.g., decompression).

In some embodiments, compression and decompression can be performed together in an integrated process, which can improve efficiency. During compression, the sensor data can be decompressed to aid in producing predictions that are used to compress the sensor data. The decompressed data that is generated during compression resembles decompressed data that would be produced be a separate and distinct decompression process employed after the sensor data is compressed. Further, in some embodiments, the compression and decompression can both be performed by the same processor and/or component. For example, the FPGA can perform the integrated compression and decompression of the sensor data.

Additional aspects of the present disclosure are directed to a computing system for training machine-learned models with lossy compressed sensor data. The computing system can include a vehicle computing system onboard an autonomous vehicle and a training computing system. The vehicle computing system can be configured to perform operations described herein with respect to obtaining sensor data, applying lossy compression, storing data describing the compressed sensor data, and decompressing the compressed sensor data to generate decompressed sensor data. The training computing system can be configured to receive the compressed sensor data from the vehicle computing system. For example, the vehicle computing system can transmit the stored compressed sensor data to the training computing system, via a wired connection and/or a wireless connection with the training computing system and/or may be relayed by a server computing system. A fleet of autonomous vehicles can be configured to compress, store, and decompress sensor data as described herein. The compressed sensor data can be collected at the training computing system from respective autonomous vehicles of the fleet and used to train one or more machine-learned models of the autonomy computing system (e.g., perception system, prediction system, and/or motion planning system). The training computing system can train one or more machine-learned models based on the compressed sensor data from one or more autonomous vehicles. Once trained, the model(s) can be distributed to the fleet of autonomous vehicles (e.g., as system updates). Thus, in some embodiments described above, the machine-learned model(s) of the autonomy system can be previously trained using training sensor data that was previously compressed with the lossy compression (e.g., sensor data that was collected onboard the same autonomous vehicle and/or other autonomous vehicles of the fleet).

Data describing the decompressed sensor data can be input into the autonomy system, which can include one or more machine-learned models. The autonomy system can be configured to control operations of the autonomous vehicle based on the decompressed sensor data, for example based on output from the machine-learned model(s). The machine-learned models of the autonomy system can include machine-learned models configured to perform perception tasks, prediction tasks, motion planning tasks, and/or other tasks related to operating the autonomous vehicle. As examples, the autonomy system can include one or more object-recognition models configured to detect and/or recognize objects, such as vehicles, pedestrians, cyclists, buildings, signs, etc. in an environment of the autonomous vehicle. The autonomy system can include one or more prediction machine-learned models configured to output data describing predicted trajectories or paths of actors (e.g., vehicles, pedestrians, cyclists, etc.) around the autonomous vehicle. The autonomy system can include one or more motion-planning machine-learned models configured to output and/or update a motion plan for the autonomous vehicle as it navigates through its environment. The motion plan can describe a trajectory (e.g., including speed and heading for the autonomous vehicle through its surroundings.

The machine-learned models described herein can be or can otherwise include one or more various model(s) such as, for example, decision tree-based models (e.g., random forest models such as boosted random forest classifiers), neural networks (e.g., deep neural networks), or other multi-layer non-linear models. Neural networks can include recurrent neural networks (e.g., long short-term memory recurrent neural networks), feed-forward neural networks, convolutional neural networks, and/or other forms of neural networks.

Various means can be configured to perform the methods and processes described herein. For example, the means can include sensor unit(s), model training unit(s), server computing unit(s), vehicle computing unit(s) and/or other means for performing the operations and functions described herein. In some implementations, one or more of the units may be implemented separately. In some implementations, one or more units may be a part of or included in one or more other units. These means can include processor(s), microprocessor(s), graphics processing unit(s), logic circuit(s), dedicated circuit(s), application-specific integrated circuit(s), programmable array logic, field-programmable gate array(s), controller(s), microcontroller(s), and/or other suitable hardware. The means can also, or alternately, include software control means implemented with a processor or logic circuitry for example. The means can include or otherwise be able to access memory such as, for example, one or more non-transitory computer-readable storage media, such as random-access memory, read-only memory, electrically erasable programmable read-only memory, erasable programmable read-only memory, flash/other memory device(s), data registrar(s), database(s), and/or other suitable hardware.

The means can be programmed to perform one or more algorithm(s) for carrying out the operations and functions described herein. For instance, the means can be configured to obtain sensor data from by one or more sensors of the autonomous vehicle. The sensor unit(s) is one example means for generating sensor data. The sensor unit(s) can include camera(s), LIDAR sensor(s), radar sensor(s), or any other sensor suitable for detecting information about the surrounding environment of the autonomous vehicle. The vehicle computing unit(s) is one example means for obtaining the sensor data from the sensor(s) of the autonomous vehicle.

The means can be configured to apply lossy compression to the sensor data to generate compressed sensor data. As one example, a block-oriented integer-discrete cosine transform algorithm, such as the H264 compression codec, can be employed. In some embodiments, the means for compressing the sensor data can include one or more field programmable gate arrays. The vehicle computing unit(s) are one example means for applying lossy compression to the sensor data to generate compressed sensor data.

The means can be configured to store data describing the compressed sensor data. For example, the means can store the compressed sensor data in local memory onboard the autonomous vehicle. The memory unit(s) are one example means for storing the data describing the compressed sensor data.

The means can be configured to decompress the compressed sensor data to generate decompressed sensor data. For example, the means can be configured to decompress the compressed sensor data in a continuous stream of data processing. In some embodiments, the means for decompressing the compressed sensor data can include one or more field programmable gate arrays. The vehicle computing unit(s) are one example means for decompressing the compressed sensor data to generate decompressed sensor data.

The means can be configured to input data describing the decompressed sensor data into an autonomy system including one or more machine-learned models. The autonomy system can be configured to control operations of the autonomous vehicle based on the decompressed sensor data. The vehicle computing unit(s) and autonomy unit(s) are example means for inputting data describing the decompressed sensor data into the autonomy system.

In some embodiments, the means can be configured to receive compressed sensor data from the vehicle computing system. For example, the vehicle computing system can transmit the stored compressed sensor data to the training computing system. The compressed sensor data can be transmitted via a wired connection and/or a wireless connection and/or may be relayed by a server computing system to the training computing system. The model training unit(s) are one example means for receiving the compressed sensor data.

The means can be configured to train one or more machine-learned models based on the compressed sensor data. For example, one or more machine-learned models of the autonomy computing system (e.g., of a perception system, prediction system, and/or motion planning system) can be trained based on the compressed sensor data. The model training unit(s) are one example means for training the machine-learned models.

Example aspects of the present disclosure can provide for a number of technical effects and benefits. Sensor data compressed with a lossy compression technique is generally smaller than uncompressed sensor data or compressed with a lossless technique, which can provide various technical effects and benefits. As one example, applying lossy compression to the sensor data to generate compressed sensor data onboard the autonomous vehicle and storing data describing the compressed sensor data can reduce storage capacity requirements onboard the autonomous vehicle and/or reduce downtime to offload such stored data. Further, transferring sensor data that is compressed with a lossy technique from the autonomous vehicle to another storage location, such as a database computing system, requires less computational and communication bandwidth than transferring uncompressed or losslessly compressed sensor data. As a further example, subsequent training of machine learned models using the compressed sensor data can require less computational resources. Accordingly, aspects of the present disclosure can provide a variety of technical effects and benefits.

FIG. 1 depicts a block diagram of an example system 100 for controlling and communicating with a vehicle according to example aspects of the present disclosure. As illustrated, FIG. 1 shows a system 100 that can include a vehicle 105 and a vehicle computing system 110 associated with the vehicle 105. The vehicle computing system 110 can be located onboard the vehicle 105 (e.g., it can be included on and/or within the vehicle 105).

The vehicle 105 incorporating the vehicle computing system 110 can be various types of vehicles. For instance, the vehicle 105 can be an autonomous vehicle. The vehicle 105 can be a ground-based autonomous vehicle (e.g., car, truck, bus, etc.). The vehicle 105 can be an air-based autonomous vehicle (e.g., airplane, helicopter, vertical take-off and lift (VTOL) aircraft, etc.). The vehicle 105 can be a lightweight elective vehicle (e.g., bicycle, scooter, etc.). The vehicle 105 can be another type of vehicle (e.g., watercraft, etc.). The vehicle 105 can drive, navigate, operate, etc. with minimal and/or no interaction from a human operator (e.g., driver, pilot, etc.). In some implementations, a human operator can be omitted from the vehicle 105 (and/or also omitted from remote control of the vehicle 105). In some implementations, a human operator can be included in the vehicle 105.

The vehicle 105 can be configured to operate in a plurality of operating modes. The vehicle 105 can be configured to operate in a fully autonomous (e.g., self-driving) operating mode in which the vehicle 105 is controllable without user input (e.g., can drive and navigate with no input from a human operator present in the vehicle 105 and/or remote from the vehicle 105). The vehicle 105 can operate in a semi-autonomous operating mode in which the vehicle 105 can operate with some input from a human operator present in the vehicle 105 (and/or a human operator that is remote from the vehicle 105). The vehicle 105 can enter into a manual operating mode in which the vehicle 105 is fully controllable by a human operator (e.g., human driver, pilot, etc.) and can be prohibited and/or disabled (e.g., temporary, permanently, etc.) from performing autonomous navigation (e.g., autonomous driving, flying, etc.). The vehicle 105 can be configured to operate in other modes such as, for example, park and/or sleep modes (e.g., for use between tasks/actions such as waiting to provide a vehicle service, recharging, etc.). In some implementations, the vehicle 105 can implement vehicle operating assistance technology (e.g., collision mitigation system, power assist steering, etc.), for example, to help assist the human operator of the vehicle 105 (e.g., while in a manual mode, etc.).

To help maintain and switch between operating modes, the vehicle computing system 110 can store data indicative of the operating modes of the vehicle 105 in a memory onboard the vehicle 105. For example, the operating modes can be defined by an operating mode data structure (e.g., rule, list, table, etc.) that indicates one or more operating parameters for the vehicle 105, while in the particular operating mode. For example, an operating mode data structure can indicate that the vehicle 105 is to autonomously plan its motion when in the fully autonomous operating mode. The vehicle computing system 110 can access the memory when implementing an operating mode.

The operating mode of the vehicle 105 can be adjusted in a variety of manners. For example, the operating mode of the vehicle 105 can be selected remotely, off-board the vehicle 105. For example, a remote computing system (e.g., of a vehicle provider and/or service entity associated with the vehicle 105) can communicate data to the vehicle 105 instructing the vehicle 105 to enter into, exit from, maintain, etc. an operating mode. By way of example, such data can instruct the vehicle 105 to enter into the fully autonomous operating mode.

In some implementations, the operating mode of the vehicle 105 can be set onboard and/or near the vehicle 105. For example, the vehicle computing system 110 can automatically determine when and where the vehicle 105 is to enter, change, maintain, etc. a particular operating mode (e.g., without user input). Additionally, or alternatively, the operating mode of the vehicle 105 can be manually selected via one or more interfaces located onboard the vehicle 105 (e.g., key switch, button, etc.) and/or associated with a computing device proximate to the vehicle 105 (e.g., a tablet operated by authorized personnel located near the vehicle 105). In some implementations, the operating mode of the vehicle 105 can be adjusted by manipulating a series of interfaces in a particular order to cause the vehicle 105 to enter into a particular operating mode.

The vehicle computing system 110 can include one or more computing devices located onboard the vehicle 105. For example, the computing device(s) can be located on and/or within the vehicle 105. The computing device(s) can include various components for performing various operations and functions. For instance, the computing device(s) can include one or more processors and one or more tangible, non-transitory, computer readable media (e.g., memory devices, etc.). The one or more tangible, non-transitory, computer readable media can store instructions that when executed by the one or more processors cause the vehicle 105 (e.g., its computing system, one or more processors, etc.) to perform operations and functions, such as those described herein for controlling an autonomous vehicle, communicating with other computing systems, etc.

The vehicle 105 can include a communications system 115 configured to allow the vehicle computing system 110 (and its computing device(s)) to communicate with other computing devices. The communications system 115 can include any suitable components for interfacing with one or more network(s) 120, including, for example, transmitters, receivers, ports, controllers, antennas, and/or other suitable components that can help facilitate communication. In some implementations, the communications system 115 can include a plurality of components (e.g., antennas, transmitters, and/or receivers) that allow it to implement and utilize multiple-input, multiple-output (MIMO) technology and communication techniques.

The vehicle computing system 110 can use the communications system 115 to communicate with one or more computing device(s) that are remote from the vehicle 105 over one or more networks 120 (e.g., via one or more wireless signal connections). The network(s) 120 can exchange (send or receive) signals (e.g., electronic signals), data (e.g., data from a computing device), and/or other information and include any combination of various wired (e.g., twisted pair cable) and/or wireless communication mechanisms (e.g., cellular, wireless, satellite, microwave, and radio frequency) and/or any desired network topology (or topologies). For example, the network(s) 120 can include a local area network (e.g. intranet), wide area network (e.g. Internet), wireless LAN network (e.g., via Wi-Fi), cellular network, a SATCOM network, VHF network, a HF network, a WiMAX based network, and/or any other suitable communication network (or combination thereof) for transmitting data to and/or from the vehicle 105 and/or among computing systems.

In some implementations, the communications system 115 can also be configured to enable the vehicle 105 to communicate with and/or provide and/or receive data and/or signals from a remote computing device associated with a user 125 and/or an item (e.g., an item to be picked-up for a courier service). For example, the communications system 115 can allow the vehicle 105 to locate and/or exchange communications with a user device 130 of a user 125. In some implementations, the communications system 115 can allow communication among one or more of the system(s) on-board the vehicle 105.

As shown in FIG. 1, the vehicle 105 can include one or more sensors 135, an autonomy computing system 140, a vehicle interface 145, one or more vehicle control systems 150, and other systems, as described herein. One or more of these systems can be configured to communicate with one another via one or more communication channels. The communication channel(s) can include one or more data buses (e.g., controller area network (CAN)), on-board diagnostics connector (e.g., OBD-II), and/or a combination of wired and/or wireless communication links. The onboard systems can send and/or receive data, messages, signals, etc. amongst one another via the communication channel(s).

The sensor(s) 135 can be configured to acquire sensor data 155. The sensor(s) 135 can be external sensors configured to acquire external sensor data. This can include sensor data associated with the surrounding environment of the vehicle 105. The surrounding environment of the vehicle 105 can include/be represented in the field of view of the sensor(s) 135. For instance, the sensor(s) 135 can acquire image and/or other data of the environment outside of the vehicle 105 and within a range and/or field of view of one or more of the sensor(s) 135. The sensor(s) 135 can include one or more Light Detection and Ranging (LIDAR) systems, one or more Radio Detection and Ranging (RADAR) systems, one or more cameras (e.g., visible spectrum cameras, infrared cameras, etc.), one or more motion sensors, one or more audio sensors (e.g., microphones, etc.), and/or other types of imaging capture devices and/or sensors. The one or more sensors can be located on various parts of the vehicle 105 including a front side, rear side, left side, right side, top, and/or bottom of the vehicle 105. The sensor data 155 can include image data (e.g., 2D camera data, video data, etc.), RADAR data, LIDAR data (e.g., 3D point cloud data, etc.), audio data, and/or other types of data. The vehicle 105 can also include other sensors configured to acquire data associated with the vehicle 105. For example, the vehicle 105 can include inertial measurement unit(s), wheel odometry devices, and/or other sensors.

In some implementations, the sensor(s) 135 can include one or more internal sensors. The internal sensor(s) can be configured to acquire sensor data 155 associated with the interior of the vehicle 105. For example, the internal sensor(s) can include one or more cameras, one or more infrared sensors, one or more motion sensors, one or more weight sensors (e.g., in a seat, in a trunk, etc.), and/or other types of sensors. The sensor data 155 acquired via the internal sensor(s) can include, for example, image data indicative of a position of a passenger or item located within the interior (e.g., cabin, trunk, etc.) of the vehicle 105. This information can be used, for example, to ensure the safety of the passenger, to prevent an item from being left by a passenger, confirm the cleanliness of the vehicle 105, remotely assist a passenger, etc.

In some implementations, the sensor data 155 can be indicative of one or more objects within the surrounding environment of the vehicle 105. The object(s) can include, for example, vehicles, pedestrians, bicycles, and/or other objects. The object(s) can be located in front of, to the rear of, to the side of, above, below the vehicle 105, etc. The sensor data 155 can be indicative of locations associated with the object(s) within the surrounding environment of the vehicle 105 at one or more times. The object(s) can be static objects (e.g., not in motion) and/or dynamic objects/actors (e.g., in motion or likely to be in motion) in the vehicle's environment. The sensor(s) 135 can provide the sensor data 155 to the autonomy computing system 140.

In addition to the sensor data 155, the autonomy computing system 140 can obtain map data 160. The map data 160 can provide detailed information about the surrounding environment of the vehicle 105 and/or the geographic area in which the vehicle was, is, and/or will be located. For example, the map data 160 can provide information regarding: the identity and location of different roadways, road segments, buildings, or other items or objects (e.g., lampposts, crosswalks and/or curb); the location and directions of traffic lanes (e.g., the location and direction of a parking lane, a turning lane, a bicycle lane, or other lanes within a particular roadway or other travel way and/or one or more boundary markings associated therewith); traffic control data (e.g., the location and instructions of signage, traffic lights, and/or other traffic control devices); obstruction information (e.g., temporary or permanent blockages, etc.); event data (e.g., road closures/traffic rule alterations due to parades, concerts, sporting events, etc.); nominal vehicle path data (e.g., indicate of an ideal vehicle path such as along the center of a certain lane, etc.); and/or any other map data that provides information that assists the vehicle computing system 110 in processing, analyzing, and perceiving its surrounding environment and its relationship thereto. In some implementations, the map data 160 can include high definition map data. In some implementations, the map data 160 can include sparse map data indicative of a limited number of environmental features (e.g., lane boundaries, etc.). In some implementations, the map data can be limited to geographic area(s) and/or operating domains in which the vehicle 105 (or autonomous vehicles generally) may travel (e.g., due to legal/regulatory constraints, autonomy capabilities, and/or other factors).

The vehicle 105 can include a positioning system 165. The positioning system 165 can determine a current position of the vehicle 105. This can help the vehicle 105 localize itself within its environment. The positioning system 165 can be any device or circuitry for analyzing the position of the vehicle 105. For example, the positioning system 165 can determine position by using one or more of inertial sensors (e.g., inertial measurement unit(s), etc.), a satellite positioning system, based on IP address, by using triangulation and/or proximity to network access points or other network components (e.g., cellular towers, WIFI access points, etc.) and/or other suitable techniques. The position of the vehicle 105 can be used by various systems of the vehicle computing system 110 and/or provided to a remote computing system. For example, the map data 160 can provide the vehicle 105 relative positions of the elements of a surrounding environment of the vehicle 105. The vehicle 105 can identify its position within the surrounding environment (e.g., across six axes, etc.) based at least in part on the map data 160. For example, the vehicle computing system 110 can process the sensor data 155 (e.g., LIDAR data, camera data, etc.) to match it to a map of the surrounding environment to get an understanding of the vehicle's position within that environment. Data indicative of the vehicle's position can be stored, communicated to, and/or otherwise obtained by the autonomy computing system 140.

The autonomy computing system 140 can perform various functions for autonomously operating the vehicle 105. For example, the autonomy computing system 140 can perform the following functions: perception 170A, prediction 170B, and motion planning 170C. For example, the autonomy computing system 140 can obtain the sensor data 155 via the sensor(s) 135, process the sensor data 155 (and/or other data) to perceive its surrounding environment, predict the motion of objects within the surrounding environment, and generate an appropriate motion plan through such surrounding environment. In some implementations, these autonomy functions can be performed by one or more sub-systems such as, for example, a perception system, a prediction system, a motion planning system, and/or other systems that cooperate to perceive the surrounding environment of the vehicle 105 and determine a motion plan for controlling the motion of the vehicle 105 accordingly. In some implementations, one or more of the perception, prediction, and/or motion planning functions 170A, 170B, 170C can be performed by (and/or combined into) the same system and/or via shared computing resources. In some implementations, one or more of these functions can be performed via different sub-systems. As further described herein, the autonomy computing system 140 can communicate with the one or more vehicle control systems 150 to operate the vehicle 105 according to the motion plan (e.g., via the vehicle interface 145, etc.).

The vehicle computing system 110 (e.g., the autonomy computing system 140) can identify one or more objects within the surrounding environment of the vehicle 105 based at least in part on the sensor data from the sensors 135 and/or the map data 160. The objects perceived within the surrounding environment can be those within the field of view of the sensor(s) 135 and/or predicted to be occluded from the sensor(s) 135. This can include object(s) not in motion or not predicted to move (static objects) and/or object(s) in motion or predicted to be in motion (dynamic objects/actors). The vehicle computing system 110 (e.g., performing the perception function 170C, using a perception system, etc.) can process the sensor data 155, the map data 160, etc. to obtain perception data 175A. The vehicle computing system 110 can generate perception data 175A that is indicative of one or more states (e.g., current and/or past state(s)) of one or more objects that are within a surrounding environment of the vehicle 105. For example, the perception data 175A for each object can describe (e.g., for a given time, time period) an estimate of the object's: current and/or past location (also referred to as position); current and/or past speed/velocity; current and/or past acceleration; current and/or past heading; current and/or past orientation; size/footprint (e.g., as represented by a bounding shape, object highlighting, etc.); class (e.g., pedestrian class vs. vehicle class vs. bicycle class, etc.), the uncertainties associated therewith, and/or other state information. The vehicle computing system 110 can utilize one or more algorithms and/or machine-learned model(s) that are configured to identify object(s) based at least in part on the sensor data 155. This can include, for example, one or more neural networks trained to identify object(s) within the surrounding environment of the vehicle 105 and the state data associated therewith. The perception data 175A can be utilized for the prediction function 170B of the autonomy computing system 140.

The vehicle computing system 110 can be configured to predict a motion of the object(s) within the surrounding environment of the vehicle 105. For instance, the vehicle computing system 110 can generate prediction data 175B associated with such object(s). The prediction data 175B can be indicative of one or more predicted future locations of each respective object. For example, the prediction system 170B can determine a predicted motion trajectory along which a respective object is predicted to travel over time. A predicted motion trajectory can be indicative of a path that the object is predicted to traverse and an associated timing with which the object is predicted to travel along the path. The predicted path can include and/or be made up of a plurality of way points. In some implementations, the prediction data 175B can be indicative of the speed and/or acceleration at which the respective object is predicted to travel along its associated predicted motion trajectory. The vehicle computing system 110 can utilize one or more algorithms and/or machine-learned model(s) that are configured to predict the future motion of object(s) based at least in part on the sensor data 155, the perception data 175A, map data 160, and/or other data. This can include, for example, one or more neural networks trained to predict the motion of the object(s) within the surrounding environment of the vehicle 105 based at least in part on the past and/or current state(s) of those objects as well as the environment in which the objects are located (e.g., the lane boundary in which it is travelling, etc.). The prediction data 175B can be utilized for the motion planning function 170C of the autonomy computing system 140.

The vehicle computing system 110 can determine a motion plan for the vehicle 105 based at least in part on the perception data 175A, the prediction data 175B, and/or other data. For example, the vehicle computing system 110 can generate motion planning data 175C indicative of a motion plan. The motion plan can include vehicle actions (e.g., speed(s), acceleration(s), other actions, etc.) with respect to one or more of the objects within the surrounding environment of the vehicle 105 as well as the objects' predicted movements. The motion plan can include one or more vehicle motion trajectories that indicate a path for the vehicle 105 to follow. A vehicle motion trajectory can be of a certain length and/or time range. A vehicle motion trajectory can be defined by one or more waypoints (with associated coordinates). The planned vehicle motion trajectories can indicate the path the vehicle 105 is to follow as it traverses a route from one location to another. Thus, the vehicle computing system 110 can consider a route/route data when performing the motion planning function 170C.

The motion planning function 170C can implement an optimization algorithm, machine-learned model, etc. that considers cost data associated with a vehicle action as well as other objective functions (e.g., cost functions based on speed limits, traffic lights, etc.), if any, to determine optimized variables that make up the motion plan. The vehicle computing system 110 can determine that the vehicle 105 can perform a certain action (e.g., pass an object, etc.) without increasing the potential risk to the vehicle 105 and/or violating any traffic laws (e.g., speed limits, lane boundaries, signage, etc.). For instance, the vehicle computing system 110 can evaluate the predicted motion trajectories of one or more objects during its cost data analysis to help determine an optimized vehicle trajectory through the surrounding environment. The motion planning function 170C can generate cost data associated with such trajectories. In some implementations, one or more of the predicted motion trajectories and/or perceived objects may not ultimately change the motion of the vehicle 105 (e.g., due to an overriding factor). In some implementations, the motion plan may define the vehicle's motion such that the vehicle 105 avoids the object(s), reduces speed to give more leeway to one or more of the object(s), proceeds cautiously, performs a stopping action, passes an object, queues behind/in front of an object, etc.

The vehicle computing system 110 can be configured to continuously update the vehicle's motion plan and a corresponding planned vehicle motion trajectory. For example, in some implementations, the vehicle computing system 110 can generate new motion planning data 175C/motion plan(s) for the vehicle 105 (e.g., multiple times per second, etc.). Each new motion plan can describe a motion of the vehicle 105 over the next planning period (e.g., next several seconds, etc.). Moreover, a new motion plan may include a new planned vehicle motion trajectory. Thus, in some implementations, the vehicle computing system 110 can continuously operate to revise or otherwise generate a short-term motion plan based on the currently available data. Once the optimization planner has identified the optimal motion plan (or some other iterative break occurs), the optimal motion plan (and the planned motion trajectory) can be selected and executed by the vehicle 105.

The vehicle computing system 110 can cause the vehicle 105 to initiate a motion control in accordance with at least a portion of the motion planning data 175C. A motion control can be an operation, action, etc. that is associated with controlling the motion of the vehicle 105. For instance, the motion planning data 175C can be provided to the vehicle control system(s) 150 of the vehicle 105. The vehicle control system(s) 150 can be associated with a vehicle interface 145 that is configured to implement a motion plan. The vehicle interface 145 can serve as an interface/conduit between the autonomy computing system 140 and the vehicle control systems 150 of the vehicle 105 and any electrical/mechanical controllers associated therewith. The vehicle interface 145 can, for example, translate a motion plan into instructions for the appropriate vehicle control component (e.g., acceleration control, brake control, steering control, etc.). By way of example, the vehicle interface 145 can translate a determined motion plan into instructions to adjust the steering of the vehicle 105 "X" degrees, apply a certain magnitude of braking force, increase/decrease speed, etc. The vehicle interface 145 can help facilitate the responsible vehicle control (e.g., braking control system, steering control system, acceleration control system, etc.) to execute the instructions and implement a motion plan (e.g., by sending control signal(s), making the translated plan available, etc.). This can allow the vehicle 105 to autonomously travel within the vehicle's surrounding environment.

The vehicle computing system 110 can store other types of data. For example, an indication, record, and/or other data indicative of the state of the vehicle (e.g., its location, motion trajectory, health information, etc.), the state of one or more users (e.g., passengers, operators, etc.) of the vehicle, and/or the state of an environment including one or more objects (e.g., the physical dimensions and/or appearance of the one or more objects, locations, predicted motion, etc.) can be stored locally in one or more memory devices of the vehicle 105. Additionally, the vehicle 105 can communicate data indicative of the state of the vehicle, the state of one or more passengers of the vehicle, and/or the state of an environment to a computing system that is remote from the vehicle 105, which can store such information in one or more memories remote from the vehicle 105. Moreover, the vehicle 105 can provide any of the data created and/or store onboard the vehicle 105 to another vehicle.

The vehicle computing system 110 can include the one or more vehicle user devices 180. For example, the vehicle computing system 110 can include one or more user devices with one or more display devices located onboard the vehicle 105. A display device (e.g., screen of a tablet, laptop, and/or smartphone) can be viewable by a user of the vehicle 105 that is located in the front of the vehicle 105 (e.g., driver's seat, front passenger seat). Additionally, or alternatively, a display device can be viewable by a user of the vehicle 105 that is located in the rear of the vehicle 105 (e.g., a back-passenger seat). The user device(s) associated with the display devices can be any type of user device such as, for example, a table, mobile phone, laptop, etc. The vehicle user device(s) 180 can be configured to function as human-machine interfaces. For example, the vehicle user device(s) 180 can be configured to obtain user input, which can then be utilized by the vehicle computing system 110 and/or another computing system (e.g., a remote computing system, etc.). For example, a user (e.g., a passenger for transportation service, a vehicle operator, etc.) of vehicle 105 can provide user input to adjust a destination location of vehicle 105. The vehicle computing system 110 and/or another computing system can update the destination location of the vehicle 105 and the route associated therewith to reflect the change indicated by the user input.

The vehicle 105 can be configured to perform vehicle services for one or a plurality of different service entities 185. A vehicle 105 can perform a vehicle service by, for example and as further described herein, travelling (e.g., traveling autonomously) to a location associated with a requested vehicle service, allowing user(s) and/or item(s) to board or otherwise enter the vehicle 105, transporting the user(s) and/or item(s), allowing the user(s) and/or item(s) to deboard or otherwise exit the vehicle 105, etc. In this way, the vehicle 105 can provide the vehicle service(s) for a service entity to a user.

A service entity 185 can be associated with the provision of one or more vehicle services. For example, a service entity can be an individual, a group of individuals, a company (e.g., a business entity, organization, etc.), a group of entities (e.g., affiliated companies), and/or another type of entity that offers and/or coordinates the provision of one or more vehicle services to one or more users. For example, a service entity can offer vehicle service(s) to users via one or more software applications (e.g., that are downloaded onto a user computing device), via a website, and/or via other types of interfaces that allow a user to request a vehicle service. As described herein, the vehicle services can include transportation services (e.g., by which a vehicle transports user(s) from one location to another), delivery services (e.g., by which a vehicle transports/delivers item(s) to a requested destination location), courier services (e.g., by which a vehicle retrieves item(s) from a requested origin location and transports/delivers the item to a requested destination location), and/or other types of services. The vehicle services can be wholly performed by the vehicle 105 (e.g., travelling from the user/item origin to the ultimate destination, etc.) or performed by one or more vehicles and/or modes of transportation (e.g., transferring the user/item at intermediate transfer points, etc.).

An operations computing system 190A of the service entity 185 can help to coordinate the performance of vehicle services by autonomous vehicles. The operations computing system 190A can include and/or implement one or more service platforms of the service entity. The operations computing system 190A can include one or more computing devices. The computing device(s) can include various components for performing various operations and functions. For instance, the computing device(s) can include one or more processors and one or more tangible, non-transitory, computer readable media (e.g., memory devices, etc.). The one or more tangible, non-transitory, computer readable media can store instructions that when executed by the one or more processors cause the operations computing system 190A (e.g., it's one or more processors, etc.) to perform operations and functions, such as those described herein matching users and vehicles/vehicle fleets, deploying vehicles, facilitating the provision of vehicle services via autonomous vehicles, etc.

A user 125 can request a vehicle service from a service entity 185. For example, the user 125 can provide user input to a user device 130 to request a vehicle service (e.g., via a user interface associated with a mobile software application of the service entity 185 running on the user device 130). The user device 130 can communicate data indicative of a vehicle service request 195 to the operations computing system 190A associated with the service entity 185 (and/or another associated computing system that can then communicate data to the operations computing system 190A). The vehicle service request 195 can be associated with a user. The associated user can be the one that submits the vehicle service request (e.g., via an application on the user device 130). In some implementations, the user may not be the user that submits the vehicle service request. The vehicle service request can be indicative of the user. For example, the vehicle service request can include an identifier associated with the user and/or the user's profile/account with the service entity 185. The vehicle service request 195 can be generated in a manner that avoids the use of personally identifiable information and/or allows the user to control the types of information included in the vehicle service request 195. The vehicle service request 195 can also be generated, communicated, stored, etc. in a secure manner to protect information.

The vehicle service request 195 can indicate various types of information. For example, the vehicle service request 195 can indicate the type of vehicle service that is desired (e.g., a transportation service, a delivery service, a courier service, etc.), one or more locations (e.g., an origin location, a destination location, etc.), timing constraints (e.g., pick-up time, drop-off time, deadlines, etc.), and/or geographic constraints (e.g., to stay within a certain area, etc.). The service request 195 can indicate a type/size/class of vehicle such as, for example, a sedan, an SUV, luxury vehicle, standard vehicle, etc. The service request 195 can indicate a product of the service entity 185. For example, the service request 195 can indicate that the user is requesting a transportation pool product by which the user would potentially share the vehicle (and costs) with other users/items. In some implementations, the service request 195 can explicitly request for the vehicle service to be provided by an autonomous vehicle or a human-driven vehicle. In some implementations, the service request 195 can indicate a number of users that will be riding in the vehicle/utilizing the vehicle service. In some implementations, the service request 195 can indicate preferences/special accommodations of an associated user (e.g., music preferences, climate preferences, wheelchair accessibility, etc.) and/or other information.

The operations computing system 190A of the service entity 185 can process the data indicative of the vehicle service request 195 and generate a vehicle service assignment that is associated with the vehicle service request. The operations computing system can identify one or more vehicles that may be able to perform the requested vehicle services to the user 195. The operations computing system 190A can identify which modes of transportation are available to a user for the requested vehicle service (e.g., light electric vehicles, human-drive vehicles, autonomous vehicles, aerial vehicle, etc.) and/or the number of transportation modes/legs of a potential itinerary of the user for completing the vehicle service (e.g., single or plurality of modes, single or plurality of legs, etc.). For example, the operations computing system 190A can determined which autonomous vehicle(s) are online with the service entity 185 (e.g., available for a vehicle service assignment, addressing a vehicle service assignment, etc.) to help identify which autonomous vehicle(s) would be able to provide the vehicle service.

The operations computing system 190A and/or the vehicle computing system 110 can communicate with one or more other computing systems 190B that are remote from the vehicle 105. This can include, for example, computing systems associated with government functions (e.g., emergency services, regulatory bodies, etc.), computing systems associated with vehicle providers other than the service entity, computing systems of other vehicles (e.g., other autonomous vehicles, aerial vehicles, etc.). Communication with the other computing systems 190B can occur via the network(s) 120.

Figure 2:
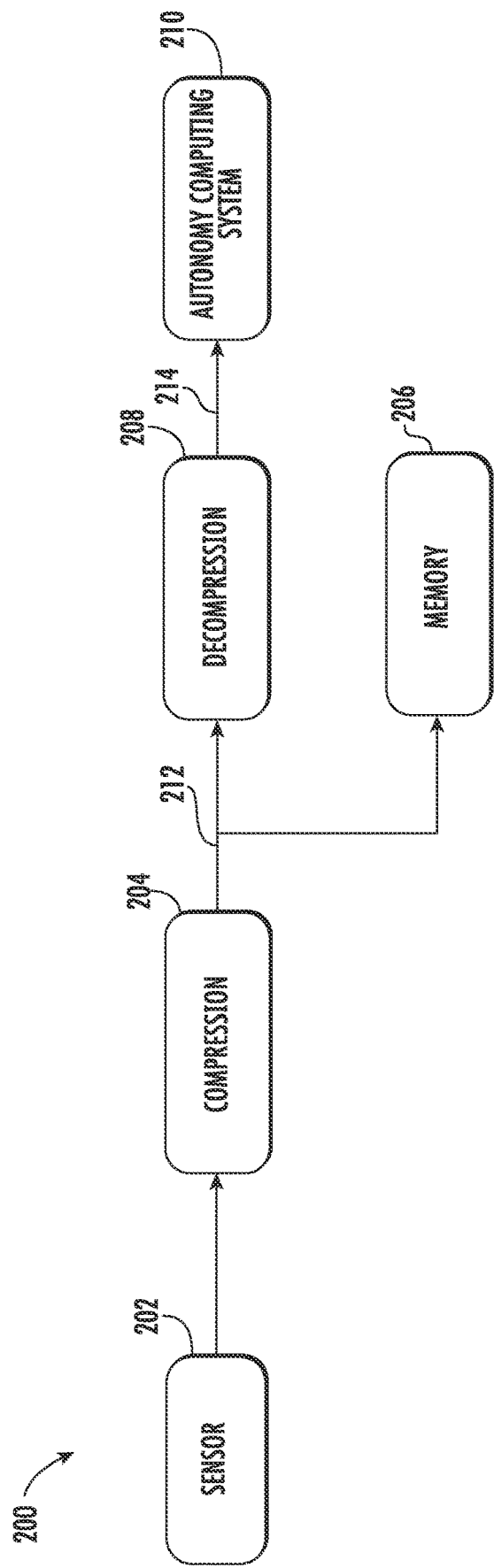
FIG. 2 is a simplified flowchart of a method for compressing and storing sensor data collected by an autonomous vehicle according to example implementations of the present disclosure.

The remote computing system(s) 190B can include server computing system(s) 192 and/or machine-learned model training computing system(s) 194. The server computing system(s) 192 and/or machine-learned model training computing system(s) 194 the can operate according to various computing architectures, including, for example, sequential computing architectures, parallel computing architectures, or some combination thereof. In some implementations, the server computing system(s) 192 and/or machine-learned model training computing system(s) 194 can be included and/or implemented by the operations computing system 190A. As indicated above, the present disclosure is generally directed to systems and methods for compressing and storing sensor data collected by an autonomous vehicle. FIG. 2 is a simplified flowchart of a method 200 for compressing and storing sensor data collected by an autonomous vehicle according to example implementations of the present disclosure. Although the method 200 of FIG. 2 is described with reference to system components of FIG. 1, it should be understood that any suitable system can be employed within the scope of the present disclosure.

According to aspects of the present disclosure, at 202, sensor data 155 can be obtained from one or more sensors 135 of the autonomous vehicle. The sensor data 155 can be compressed, at (204), using a lossy compression algorithm and then stored, at (206) onboard the autonomous vehicle for later offloading. The compressed data can be decompressed, at (208) and processed as usual by the vehicle computing system 110 (e.g., perception 170A, prediction 170B, motion planning 170C, and/or other components of the autonomy computing system 140 to operate the vehicle 105. Thus, the sensor data 155 can be compressed, at (204), and decompressed, at (208), during the data processing flow of the autonomous vehicle 105. This configuration is generally contrary to conventional knowledge and wisdom regarding processing sensor data 155 onboard autonomous vehicles. Rather, achieving very low latency processing of sensor data 155 onboard the autonomous vehicle 105 is generally an important goal that prohibits processing that is not strictly necessary to operation of the vehicle. Adding compression and subsequent decompression processing prior to inputting the sensor data 155 into the autonomy computing system 140 increases the latency of the system. Further, this compression and decompression would generally not be considered necessary to the subsequent processing by the vehicle computing system 110 (e.g., the autonomy computing system 140) for controlling the autonomous vehicle 105. Thus, performing compression and decompression as described herein would generally be considered an unexpected or unconventional method for reducing the size of logged sensor data 155. Nevertheless, aspects of the present disclosure are directed to such pre-processing of sensor data 155 as other benefits (as described herein) have been found to outweigh a small increase in latency resulting from this pre-processing.

The vehicle computing system 110 can be configured to obtain sensor data 155 generated by one or more sensors 1135 of the autonomous vehicle 105. For example, the sensor data 155 can be or include image data from a camera, LIDAR data from a LIDAR sensor, radar from a radar sensor, or any other suitable sensor data 155 generated by sensors 135 onboard autonomous vehicles 105. A lossy compression algorithm can be applied, at (204), to the sensor data 155 to generate compressed sensor data 212. The lossy compression algorithm can be or include a variety of algorithms, codecs, or the like. As one example, a block-oriented integer-discrete cosine transform algorithm, can be employed. The H264 compression codec is one example of such an algorithm. The compressed sensor data 212 can be locally stored by the vehicle computing system 110, for example in memory that is onboard the autonomous vehicle 105. The vehicle computing system 110 can decompress the sensor data 155, at (208) and input data describing the decompressed sensor data 214, at (210), into the autonomy computing system 140 of the autonomous vehicle 105. The autonomy computing system 140 can include one or more machine-learned models and can be configured to control operations of the autonomous vehicle based on the data describing the decompressed sensor data 214. Thus, the sensor data 155 can be compressed and decompressed onboard the autonomous vehicle prior 105 to being input into the autonomy computing system 140.

In some embodiments, the sensor data 155 can include image data, such as two-dimensional image data (e.g., captured from a camera onboard the autonomous vehicle 105). One example type of image data is raw Bayer data. The image data can be collected and/or generated in a variety of formats, resolutions, and the like. However, aspects of the present disclosure can apply to a variety of other types of sensor data 155, such as LIDAR point data, sonar data, radar data, infrared sensor data, and the like.

Generally, minimal processing, if any, is applied to the sensor data 155 before it is compressed, at (206). For example, before applying the lossy compression to the sensor data 155, at (206), the vehicle computing system 110 can scale, re-size (e.g., downsize), or otherwise adjust the sensor data 155. In one example embodiment, the vehicle computing system 110 can convert the sensor data 155 into a non-linear space (e.g., from a linear space). For instance, the raw image data can be generated (e.g., by the camera) in a linear color space and converted into a non-linear color space before compression is applied. Storing image data in a non-linear color space can provide several advantages over a linear color space. Non-linear mapping can be used to allocate fewer data bits to very bright areas of the image data that linear mapping allocates more data bits to very dark areas of the image data. This allocation or mapping reduces and/or removes noise from the images, thereby improving image quality. Thus, in some embodiments, some processing of the image data 155 can be performed prior to compression of the image data 155, at (206).

In some embodiments, the vehicle computing system 110 can apply a lossy compression algorithm to individual image frames of the sensor data 155 without applying motion-based compression to the image. Motion-based compression can reduce the size of the image data 155 based on how humans perceive movement as represented in a series of image frames. Generally, such motion-based compression is avoided as it can negatively affect the use and/or training of machine-learned models with the data. However, in some embodiments motion-based compression can be employed, for example if such compression has been found to not adversely affect (or minimally affect) operation and/or training of the autonomy computing system 140 (e.g., the machine-learned model(s) of the autonomy computing system 140) in particular scenarios. Thus, generally, lossy compression can be applied to individual image frames of the sensor data 155 without applying motion-based compression to the image.

In some embodiments, the vehicle computing system 110 can include a field programmable gate array. The vehicle computing system 110 can apply the lossy compression to the sensor data 155 using the field programmable gate array. Field programmable gate arrays can be particularly useful for processing data with low latency. For instance, the sensor data 155 can be processed as a continuous stream of data points, in contrast to completing a stage of processing (e.g., compression) of a particular image before starting to process the next image or beginning a subsequent stage of processing for that particular image (e.g., decompression).

Figure 3:
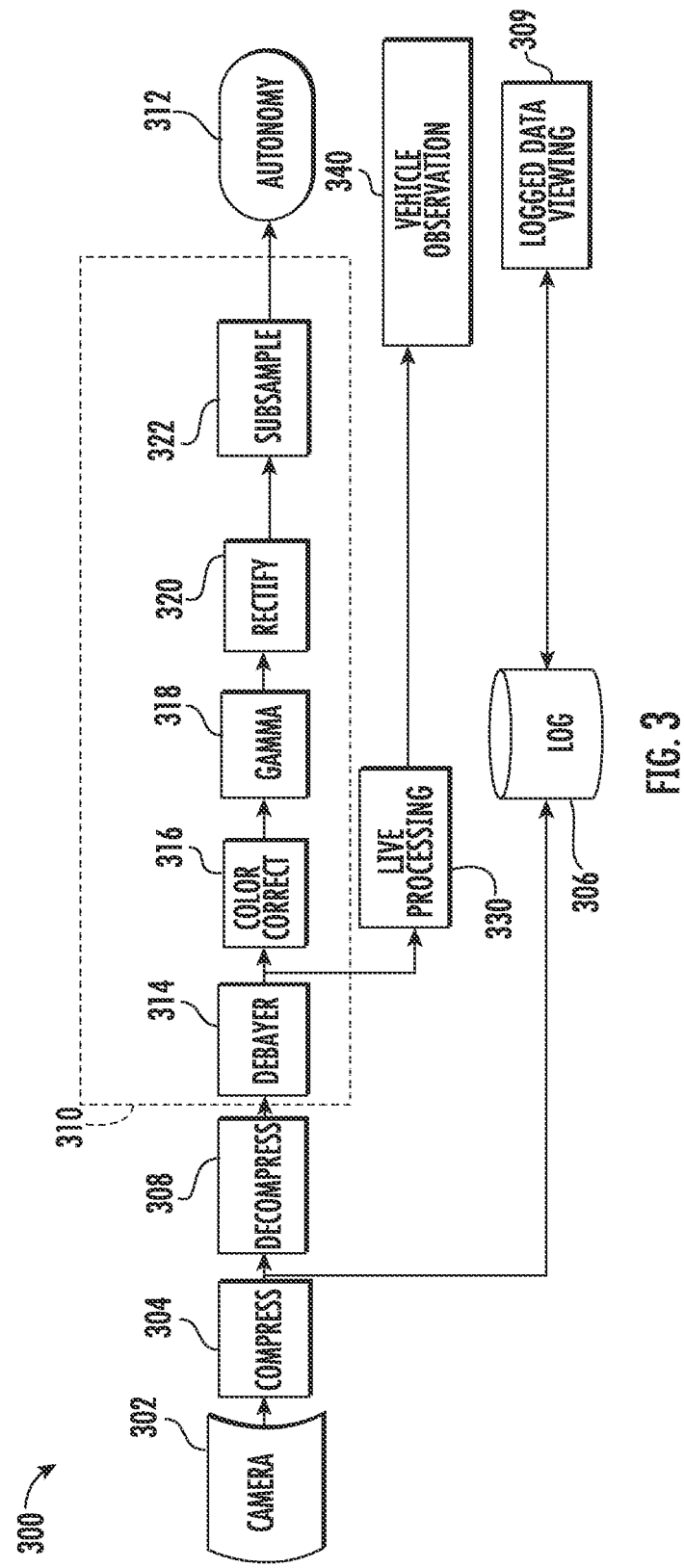
FIG. 3 is a flowchart of an example implementation of the method of FIG. 2 according to example implementations of the present disclosure.

FIG. 3 is a flowchart 300 of an example implementation of the method 200 of FIG. 2 according to example implementations of the present disclosure. At (302), the system can obtain sensor data (e.g., image data) from a sensor 302 (e.g., a camera). The system, at (304), can compress, at (304), the image data and store the compressed image data, at (306). The system, at (308), can decompress the compressed image data. The stored compressed image data can be viewed by a logged data viewing system 309. The logged data viewing system 309 can be or correspond with a remote computing system 190B, for example as described above with reference to FIG. 1.

One or more processing steps 310 can be performed with the decompressed data before the decompressed data and/or data describing the decompressed data is input into the autonomy computing system(s) 312. The processing steps 310 can include debayering the image data at (314), color correction at (316), gamma adjustments at (318), and/or rectification at (320). Additional processing can include subsampling the image data at (322) before inputting the image data into the autonomy computing system(s) 312.

In some embodiments additional processing may be performed to the image data before the image data is transmitted to a remote system 340 (e.g., for live viewing from a remote computing device at a remote location). For example, after debayering the image data at (314), copies of the image data may be processed for live viewing, at (330), (e.g., including color and/or gamma adjustments, subsampling, etc.) and the processed image data may be transmitted to the remote device 340. The remote device 340 can be or correspond with a remote computing system 190B, for example as described above with reference to FIG. 1.

Figure 4:
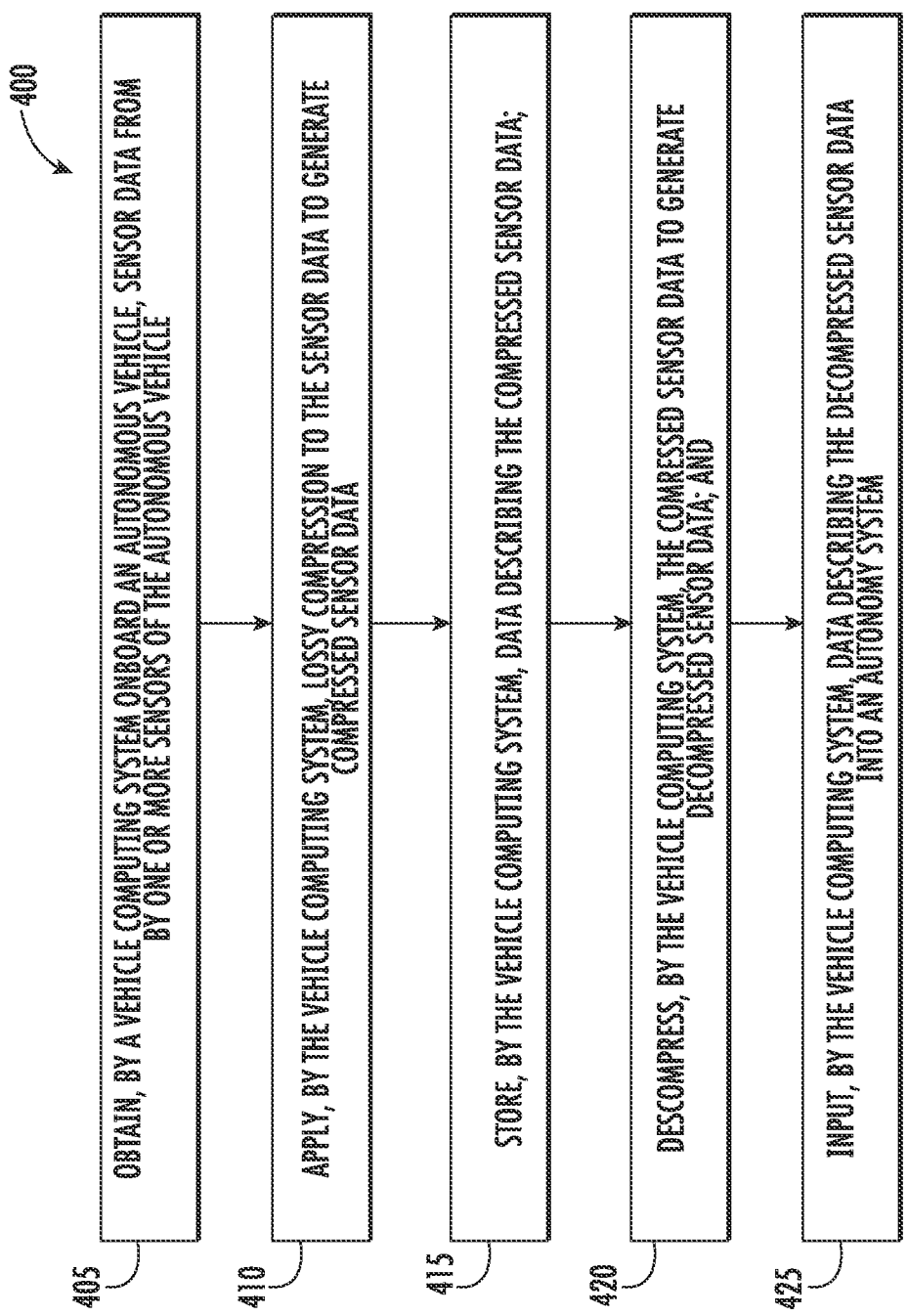
FIG. 4 is a flowchart of a method for compressing and storing sensor data collected by an autonomous vehicle according to example implementations of the present disclosure.

FIG. 4 depicts an example flow diagram of an example method 500 for compressing and storing sensor data collected by an autonomous vehicle according to example implementations of the present disclosure. Those of ordinary skill in the art, using the disclosures provided herein, will understand that the elements of any of the methods discussed herein can be adapted, rearranged, expanded, omitted, combined, and/or modified in various ways without deviating from the scope of the present disclosure. FIG. 4 is described with reference to elements/terms described with respect to other systems and figures for example illustrated purposes and is not meant to be limiting. One or more portions of method actions can be performed additionally, or alternatively, by other systems.

Figure 6:
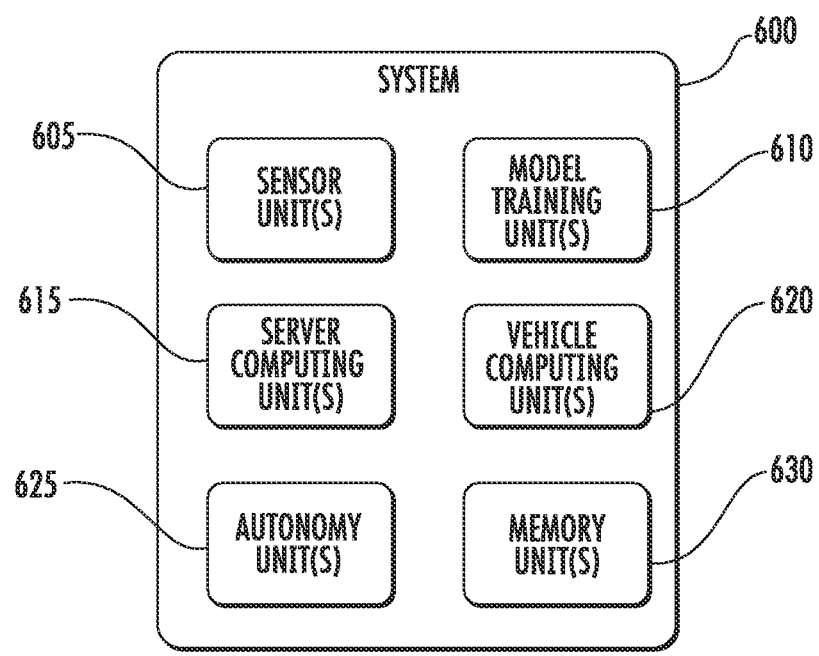
FIG. 6 depicts system components of an example system according to example implementations of the present disclosure.

At 405, the method 400 can include obtaining sensor data 155 from one or more sensors 135 of the autonomous vehicle 105. For example, the sensor data 155 can include image data from a camera, LIDAR data from a LIDAR sensor, radar from a radar sensor, or any other suitable sensor data generated by sensors employed onboard autonomous vehicles. The sensor unit(s) 605 described below with reference to FIG. 6 is one example means for obtaining the sensor data 155.

At 410, the method 400 can include applying lossy compression to the sensor data 155 to generate compressed sensor data. A variety of lossy compression algorithms, codecs, or the like can be employed or include a variety of algorithms, codecs, or the like. The H264 compression codec is one example of such an algorithm. In some embodiments, the vehicle computing system 110 can apply a lossy compression algorithm to individual image frames of the sensor data 155 without applying motion-based compression to the image. The vehicle computing unit(s) 620 described below with reference to FIG. 6 is one example means for applying lossy compression to the sensor data 155.

At 415, the method 400 can include storing data describing the compressed sensor data. The compressed sensor data can be stored onboard the vehicle computing system 110, for example in one or more memory devices that are onboard the autonomous vehicle 105. The memory unit(s) 630 described below with reference to FIG. 6 is one example means for storing data describing the compressed sensor data.

At 420, the method 400 can include decompressing the compressed sensor data to generate decompressed sensor data. The vehicle computing unit(s) 620 described below with reference to FIG. 6 is one example means for decompressing the compressed sensor data. For example, the compressed sensor data can be decompressed in a continuous stream of data processing and/or using the codec and/or algorithm used to compresses the data (e.g., a block-oriented integer-discrete cosine transform algorithm, such as the H264 compression codec). In some embodiments, the compressed sensor data can be compressed and/or decompressed using one or more field programmable gate arrays.

At 425, the method 400 can include inputting data describing the decompressed sensor data into an autonomy system 140 comprising one or more machine-learned models, for example as described above with respect to FIG. 1. The machine-learned model(s) can be trained to perform perception tasks, motion planning tasks, or other tasks associated with operation of autonomous vehicles. For instance, the machine-learned model(s) can be trained to recognize objects, anticipate actions of other actors, and/or control one or more operations of the autonomous vehicle. The machine-learned models can include, for example, decision tree-based models (e.g., random forest models such as boosted random forest classifiers), neural networks (e.g., deep neural networks), or other multi-layer non-linear models. Neural networks can include recurrent neural networks (e.g., long short-term memory recurrent neural networks), feed-forward neural networks, convolutional neural networks, and/or other forms of neural networks.

The autonomy system 140 can be configured to control operations of the autonomous vehicle 105 based on the decompressed sensor data. The autonomy unit(s) 625 and vehicle computing unit(s) 620 described below with reference to FIG. 6 are example means for inputting data describing the decompressed sensor data into the autonomy system 140.

Figure 5:
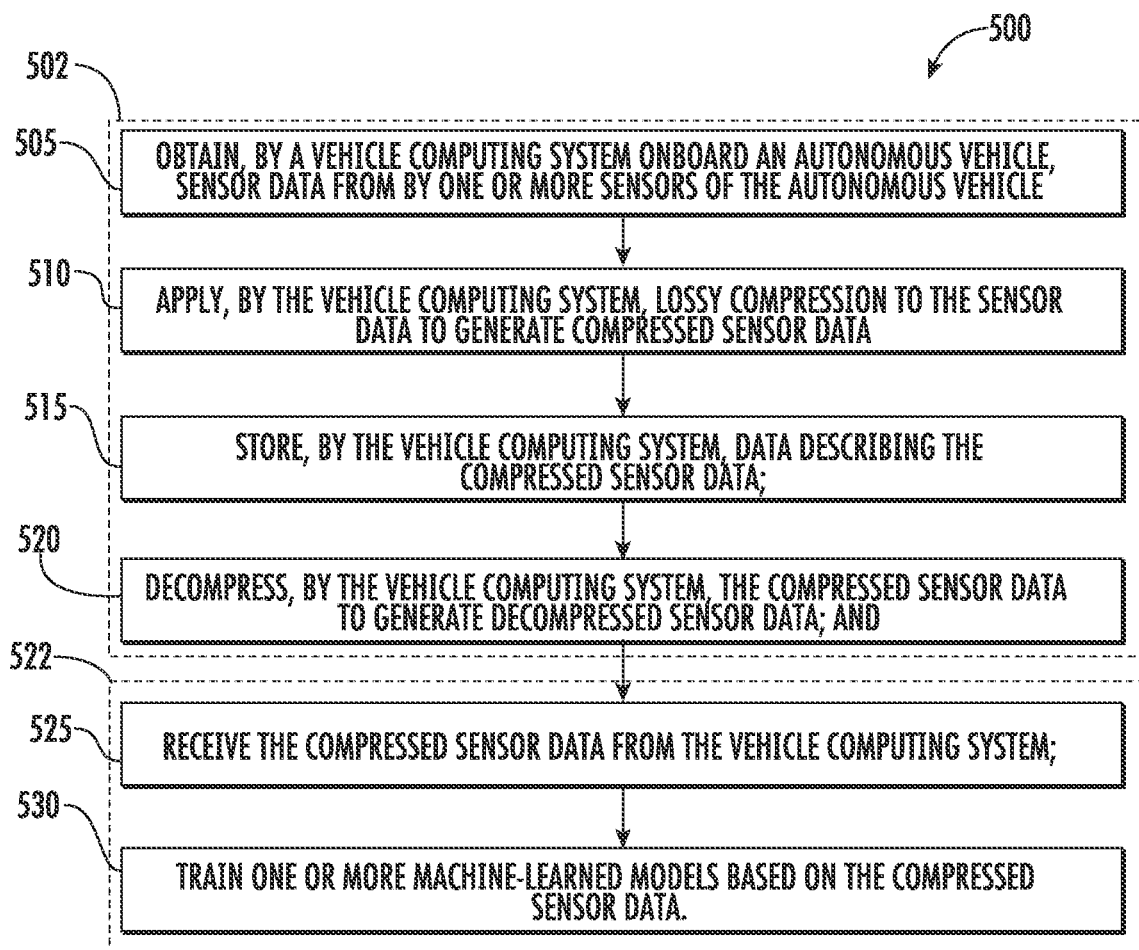
FIG. 5 is a flowchart of a method for training machine-learned models with lossy compressed sensor data according to example implementations of the present disclosure.

FIG. 5 is a flowchart of a method 500 for training machine-learned models with lossy compressed sensor data according to example implementations of the present disclosure. The method 500 can be performed by a computing system. This can include, for example, the computing system 100, which can include a vehicle computing system 110 onboard an autonomous vehicle 105 and a machine-learned model training computing system 194, for example as described above with reference to FIG. 1. The computing system 100 can be configured to perform a first group 502 of operations described herein with respect to obtaining sensor data, applying lossy compression, storing data describing the compressed sensor data, and decompressing the compressed sensor data to generate decompressed sensor data. For example, the vehicle computing system 110, at (505), can obtain sensor data 155 from by one or more sensors 135 of the autonomous vehicle 105, for example as described above with reference to FIG. 5A. The vehicle computing system 110, at (510), can apply lossy compression to the sensor data to generate compressed sensor data, for example as described above with reference to FIG. 5A. The vehicle computing system 110, at (515), can store data describing the compressed sensor data, for example as described above with reference to FIG. 5A. The vehicle computing system 110, at (520), can decompress the compressed sensor data to generate decompressed sensor data. For example, the compressed sensor data can be decompressed in a continuous stream of data processing. In some embodiments, the compressed sensor data can be compressed and/or decompressed using one or more field programmable gate arrays. The compressed sensor data can be decompressed using the same algorithm or codec used to compress the sensor data (e.g., a block-oriented integer-discrete cosine transform algorithm, such as the H264 compression codec).

The machine-learned model training computing system 194 can be configured to perform a second group 522 of operations. For example, the machine-learned model training computing system 194, at (525) can receive the compressed sensor data from the vehicle computing system 110. For example, the vehicle computing system 110 can transmit the stored compressed sensor data to the machine-learned model training computing system 194, via a wired connection and/or a wireless connection with the training computing system and/or may be relayed by a server computing system 192. The server computing system 192 and/or the machine-learned computing system 194 can obtain compressed sensor data from one or more autonomous vehicles. For instance, a fleet of autonomous vehicles 105 can be configured to compress, store, and decompress sensor data as described herein. The compressed sensor data can be collected at the machine-learned model training computing system 194 from respective autonomous vehicles 105 of the fleet.

The machine-learned model training computing system 194, at (530), can train one or more machine-learned models of the autonomy computing system 140 (e.g., the perception system 170A, prediction system 170B, and/or motion planning system 170C). The machine-learned model training computing system 194 can train one or more machine-learned models based on the compressed sensor data from one or more autonomous vehicles 105. Once trained, the model(s) can be distributed to the fleet of autonomous vehicles 105 (e.g., as system updates). Thus, in some embodiments described above, the machine-learned model(s) of the autonomy system 140 can be previously trained using training sensor data that was previously compressed with the lossy compression (e.g., sensor data 155 that was collected onboard the same autonomous vehicle 105 and/or other autonomous vehicles 105 of the fleet).

Data describing the decompressed sensor data can be input into the autonomy system 140, which can include one or more machine-learned models. The autonomy system 140 can be configured to control operations of the autonomous vehicle based on the decompressed sensor data, for example based on output from the machine-learned model(s) (e.g., of the perception system 170A, prediction system 170B, and/or motion planning system 170C). The machine-learned models of the autonomy system 140 can include machine-learned models configured to perform perception tasks, prediction tasks, motion planning tasks, and/or other tasks related to operating the autonomous vehicle 105. As examples, the autonomy system 140 (e.g., a perception system) can include one or more object-recognition models configured to detect and/or recognize objects, such as vehicles, pedestrians, cyclists, buildings, signs, etc. in an environment of the autonomous vehicle. The autonomy system 140 (e.g., a prediction system) can include one or more prediction machine-learned models configured to output data describing predicted trajectories or paths of actors (e.g., vehicles, pedestrians, cyclists, etc.) around the autonomous vehicle 105. The autonomy system 140 (e.g., a motion planning system) can include one or more motion-planning machine-learned models configured to output and/or update a motion plan for the autonomous vehicle 140 as it navigates through its environment. The motion plan can describe a trajectory (e.g., including speed and heading for the autonomous vehicle through its surroundings.

The machine-learned models described herein can be or can otherwise include one or more various model(s) such as, for example, decision tree-based models (e.g., random forest models such as boosted random forest classifiers), neural networks (e.g., deep neural networks), or other multi-layer non-linear models. Neural networks can include recurrent neural networks (e.g., long short-term memory recurrent neural networks), feed-forward neural networks, convolutional neural networks, and/or other forms of neural networks.

The compressed sensor data can be remotely used for purposes in addition to training the machine-learned model(s) as described above. For example one or more remote computing system(s) (e.g., the server computing system(s) 192, machine-learned model training computing system 194, and/or one or more computing system of different service entities 185 can receive the compressed sensor data. The such remote computing systems can be used to review performance of the autonomous vehicle 105 (e.g., when the autonomous vehicle(s) 105 did not act as desired). As a further example, such remote computing systems can be used to simulate, review performance thereof, and/or verify one or more updates, systems, machine learned model(s), firmware updates, or the like of the autonomous vehicle 105 before such systems or updates are deployed to actual autonomous vehicles 105. For example, the models can also be tested using the same data that was used to train models. For example, offline simulations can be conducted in which the models can be used to process the same data that models process onboard autonomous vehicle during normal operation. This capability can be particularly useful for testing new model architectures, types, training techniques, and the like.

Thus, improved routing and storing of the compressed sensor data can improve an ability to manage a fleet of autonomous vehicles.

FIG. 6 depicts system components of an example system 600 according to example implementations of the present disclosure. Various means can be configured to perform the methods and processes described herein. For example, the means can include sensor unit(s) 605, model training unit(s) 610, server computing unit(s) 615, vehicle computing unit(s) 620, and/or other means for performing the operations and functions described herein. In some implementations, one or more of the units may be implemented separately. In some implementations, one or more units may be a part of or included in one or more other units. These means can include processor(s), microprocessor(s), graphics processing unit(s), logic circuit(s), dedicated circuit(s), application-specific integrated circuit(s), programmable array logic, field-programmable gate array(s), controller(s), microcontroller(s), and/or other suitable hardware. The means can also, or alternately, include software control means implemented with a processor or logic circuitry for example. The means can include or otherwise be able to access memory such as, for example, one or more non-transitory computer-readable storage media, such as random-access memory, read-only memory, electrically erasable programmable read-only memory, erasable programmable read-only memory, flash/other memory device(s), data registrar(s), database(s), and/or other suitable hardware.

The means can be programmed to perform one or more algorithm(s) for carrying out the operations and functions described herein. For instance, the means can be configured to obtain sensor data from by one or more sensors of the autonomous vehicle. The sensor unit(s) 605 is one example means for generating sensor data. The sensor unit(s) 605 can include camera(s), LIDAR sensor(s), radar sensor(s), or any other sensor suitable for detecting information about the surrounding environment of the autonomous vehicle. The vehicle computing unit(s) 620 is one example means for obtaining the sensor data from the sensor(s) of the autonomous vehicle.

The means can be configured to apply lossy compression to the sensor data to generate compressed sensor data. As one example, a block-oriented integer-discrete cosine transform algorithm, such as the H264 compression codec, can be employed. In some embodiments, the means for compressing the sensor data can include one or more field programmable gate arrays. The vehicle computing unit(s) 620 is one example means for applying lossy compression to the sensor data to generate compressed sensor data.

The means can be configured to store data describing the compressed sensor data. For example, the means can store the compressed sensor data in local memory onboard the autonomous vehicle. The memory unit(s) 630 is one example means for storing the data describing the compressed sensor data.

The means can be configured to decompress the compressed sensor data to generate decompressed sensor data. For example, the means can be configured to decompress the compressed sensor data in a continuous stream of data processing. In some embodiments, the means for decompressing the compressed sensor data can include one or more field programmable gate arrays and/or using the same algorithm of codec used to compress the sensor data. The vehicle computing unit(s) 620 is one example means for decompressing the compressed sensor data to generate decompressed sensor data.

The means can be configured to input data describing the decompressed sensor data into an autonomy system including one or more machine-learned models. The autonomy system can be configured to control operations of the autonomous vehicle based on the decompressed sensor data. The vehicle computing unit(s) 620 and autonomy unit(s) 625 are example means for inputting data describing the decompressed sensor data into the autonomy system.

In some embodiments, the means can be configured to receive compressed sensor data from the vehicle computing system. For example, the vehicle computing system can transmit the stored compressed sensor data to the training computing system. The compressed sensor data can be transmitted via a wired connection and/or a wireless connection and/or may be relayed by a server computing system to the training computing system. The model training 610 unit(s) are one example means for receiving the compressed sensor data.

The means can be configured to train one or more machine-learned models based on the compressed sensor data. For example, one or more machine-learned models of the autonomy computing system (e.g., of a perception system, prediction system, and/or motion planning system) can be trained based on the compressed sensor data. The model training unit(s) 610 are one example means for training the machine-learned models.

Example aspects of the present disclosure can provide for a number of technical effects and benefits. Sensor data compressed with a lossy compression technique is generally smaller than uncompressed sensor data or compressed with a lossless technique, which can provide various technical effects and benefits. As one example, applying lossy compression to the sensor data to generate compressed sensor data onboard the autonomous vehicle and storing data describing the compressed sensor data can reduce storage capacity requirements onboard the autonomous vehicle and/or reduce downtime to offload such stored data. Further, transferring sensor data that is compressed with a lossy technique from the autonomous vehicle to another storage location, such as a database computing system, requires less computational and communication bandwidth than transferring uncompressed or losslessly compressed sensor data. As a further example, subsequent training of machine learned models using the compressed sensor data can require less computational resources. Accordingly, aspects of the present disclosure can provide a variety of technical effects and benefits.

Figure 7:
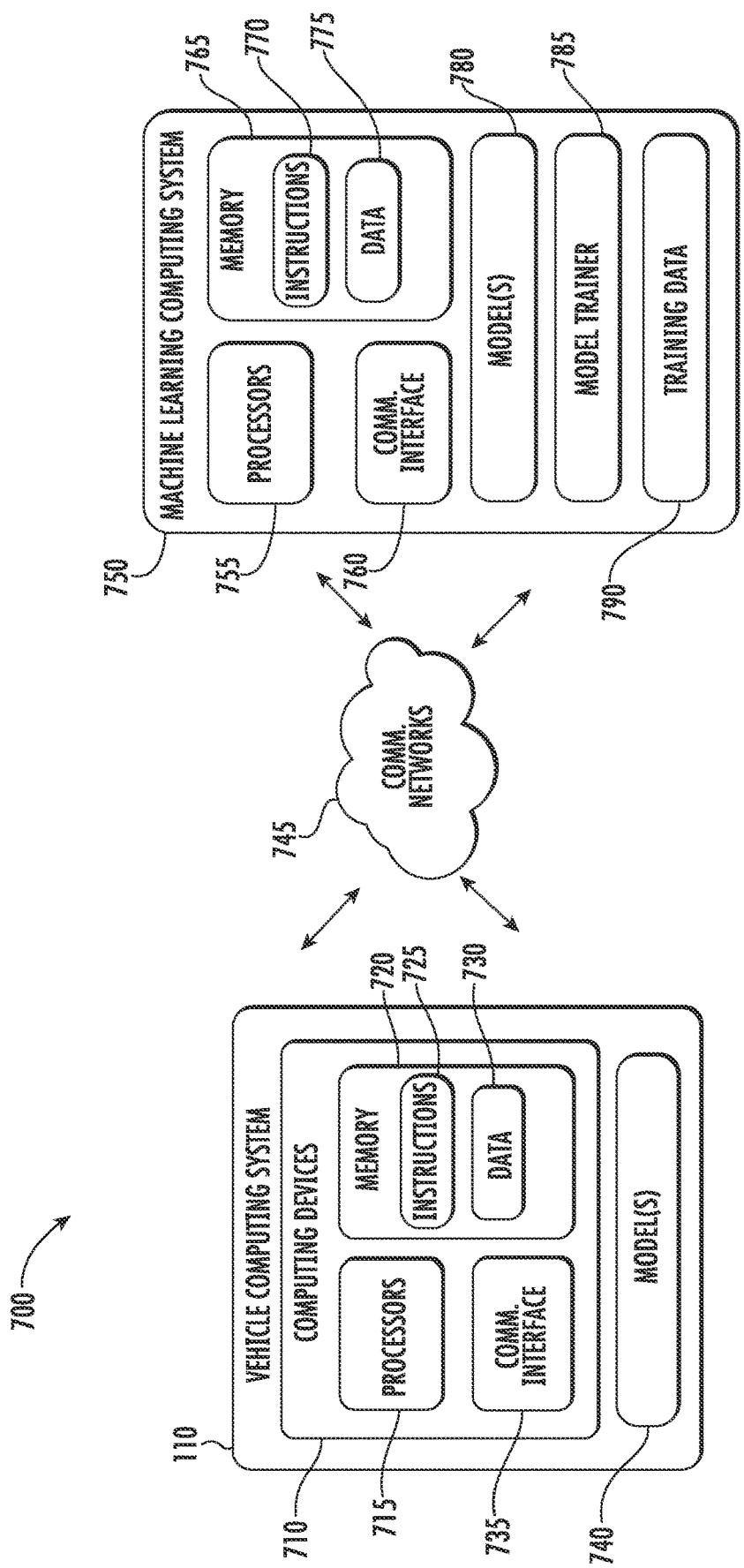
FIG. 7 depicts system components of an example system according to example implementations of the present disclosure.

FIG. 7 depicts system components of an example system according to example implementations of the present disclosure. The example system 700 illustrated in FIG. 7 is provided as an example only. The components, systems, connections, and/or other aspects illustrated in FIG. 7 are optional and are provided as examples of what is possible, but not required, to implement the present disclosure. The example system 700 can include the vehicle computing system 110 of FIG. 1 and a machine learning computing system 750 that are communicatively coupled over one or more network(s) 745. The computing system 700 can be associated with an operations system and/or an entity associated with the vehicle 105 such as, for example, a vehicle owner, vehicle manager, fleet operator, service provider, etc.

The computing device(s) 710 of the computing system 110 can include processor(s) 715 and at least one memory 720. The one or more processors 715 can be any suitable processing device (e.g., a processor core, a microprocessor, an ASIC, an FPGA, a controller, a microcontroller, etc.) and can be one processor or a plurality of processors that are operatively connected. The memory 720 can include one or more non-transitory computer-readable storage media, such as RAM, ROM, EEPROM, EPROM, one or more memory devices, flash memory devices, magnetic disks, data registers, etc., and combinations thereof.

The memory 720 can store information that can be accessed by the one or more processors 715. For instance, the memory 720 (e.g., one or more non-transitory computer-readable storage mediums, memory devices) can include computer-readable instructions 725 that can be executed by the one or more processors 715. The instructions 725 can be software written in any suitable programming language or can be implemented in hardware. Additionally, or alternatively, the instructions 725 can be executed in logically and/or virtually separate threads on processor(s) 715.

For example, the memory 720 on-board the vehicle 105 can store instructions 725 that when executed by the one or more processors 715 cause the one or more processors 715 (e.g., in the vehicle computing system 110) to perform operations such as any of the operations and functions of the computing device(s) 710 and/or vehicle computing system 110 (and its sub-systems (e.g., a motion planner, etc.)), any of the operations and functions for which the vehicle computing system 110 (and/or its subsystems) are configured, any portions of the methods described herein, and/or any other operations and functions described herein. Memory for a system offboard a vehicle can store instructions to perform any operations and functions of the offboard systems described herein and/or the operations and functions of the autonomous vehicle (its computing system), methods, and/or any other operations and functions described herein.

The memory 720 can store data 730 that can be obtained (e.g., received, accessed, written, manipulated, created, generated, etc.) and/or stored. The data 730 can include, for instance, services data (e.g., trip data, route data, user data, etc.), sensor data (e.g., LIDAR point data, sonar data, radar data, infrared sensor data, and the like), map data, perception data, prediction data, motion planning data, and/or other data/information as described herein. In some implementations, the computing device(s) 710 can obtain data from one or more memories that are remote from the autonomous vehicle 105.

The computing device(s) 710 can also include a communication interface 735 used to communicate with one or more other system(s) (e.g., the remote computing system). The communication interface 735 can include any circuits, components, software, etc. for communicating via one or more networks (e.g., network(s)). In some implementations, the communication interface 735 can include, for example, one or more of: a communications controller, a receiver, a transceiver, a transmitter, a port, conductors, software, and/or hardware for communicating data.

The machine learning computing system 750 can include one or more processors 755 and a memory 765. The one or more processors 755 can be any suitable processing device (e.g., a processor core, a microprocessor, an ASIC, a FPGA, a controller, a microcontroller, etc.) and can be one processor or a plurality of processors that are operatively connected. The memory 665 can include one or more non-transitory computer-readable storage media, such as RAM, ROM, EEPROM, EPROM, one or more memory devices, flash memory devices, etc., and/or combinations thereof.

The memory 765 can store information that can be accessed by the one or more processors 755. For instance, the memory 765 (e.g., one or more non-transitory computer-readable storage mediums, memory devices, etc.) can store data 775 that can be obtained (e.g., generated, retrieved, received, accessed, written, manipulated, created, stored, etc.). In some implementations, the machine learning computing system 750 can obtain data from one or more memories that are remote from the machine learning computing system 750.

The memory 765 can also store computer-readable instructions 760 that can be executed by the one or more processors 755. The instructions 760 can be software written in any suitable programming language or can be implemented in hardware. Additionally, or alternatively, the instructions 760 can be executed in logically and/or virtually separate threads on processor(s) 755. The memory 765 can store the instructions 760 that when executed by the one or more processors 755 cause the one or more processors 755 to perform operations. The machine learning computing system 750 can include a communication interface 770, including devices and/or functions similar to that described with respect to the communication interface 735 of the vehicle computing system 110.

In some implementations, the machine learning computing system 750 can include one or more server computing devices. If the machine learning computing system 750 includes multiple server computing devices, such server computing devices can operate according to various computing architectures, including, for example, sequential computing architectures, parallel computing architectures, or some combination thereof.

In addition, or alternatively to the model(s) 740 at the vehicle computing system 110, the machine learning computing system 750 can include one or more machine-learned model(s) 780. As examples, the machine-learned model(s) 780 can be or can otherwise include various machine-learned models such as, for example, neural networks (e.g., deep neural networks), support vector machines, decision trees, ensemble models, k-nearest neighbors models, Bayesian networks, or other types of models including linear models and/or non-linear models. Example neural networks include feed-forward neural networks (e.g., convolutional neural networks), recurrent neural networks (e.g., long short-term memory recurrent neural networks, etc.), and/or other forms of neural networks. The machine-learned models 780 can be similar to and/or the same as the machine-learned models 740, and/or any of the models discussed herein.

As an example, the machine learning computing system 750 can communicate with the vehicle computing system 110 according to a client-server relationship. For example, the machine learning computing system 750 can implement the machine-learned models 780 to provide a web service to the vehicle computing system 110 (e.g., including on a vehicle, implemented as a system remote from the vehicle, etc.). For example, the web service can provide machine-learned models to an entity associated with a vehicle; such that the entity can implement the machine-learned model. Thus, machine-learned models 780 can be located and used at the vehicle computing system 110 (e.g., on the vehicle 105, etc.) and/or the machine-learned models 780 can be located and used at the machine learning computing system 750.

In some implementations, the machine learning computing system 750 and/or the vehicle computing system 110 can train the machine-learned model(s) 740 and/or 780 through use of a model trainer 785. The model trainer 785 can train the machine-learned models 740 and/or 780 using one or more training or learning algorithm(s), for example as described above with reference to FIG. 5. The model trainer 785 can perform backwards propagation of errors, supervised training techniques using a set of labeled training data, and/or unsupervised training techniques using a set of unlabeled training data. The model trainer 785 can perform a number of generalization techniques to improve the generalization capability of the models being trained. Generalization techniques include weight decays, dropouts, or other techniques.

The model trainer 780 can train a machine-learned model (e.g., 740 and/or 780) based on a set of training data 790. The training data 790 can include, for example, labeled datasets and/or unlabeled datasets. For example, the training data 790 can include data stored, at (306) as described with reference to FIG. 3.

In some implementations, the training data 790 can be taken from the same vehicle as that which utilizes the model(s) 740 and/or 780. Accordingly, the model(s) 740 and/or 780 can be trained to determine outputs in a manner that is tailored to that particular vehicle. Additionally, or alternatively, the training data 790 can be taken from one or more different vehicles than that which is utilizing the model(s) 740 and/or 780. The model trainer 785 can be implemented in hardware, firmware, and/or software controlling one or more processors. Additionally, or alternatively, other data sets can be used to train the model(s) (e.g., models 740 and/or 780) including, for example, publicly accessible datasets (e.g., labeled data sets, unlabeled data sets, etc.).

The network(s) 745 can be any type of network or combination of networks that allows for communication between devices. In some embodiments, the network(s) 745 can include one or more of a local area network, wide area network, the Internet, secure network, cellular network, mesh network, peer-to-peer communication link and/or some combination thereof and can include any number of wired or wireless links. Communication over the network(s) 745 can be accomplished, for instance, via a network interface using any type of protocol, protection scheme, encoding, format, packaging, etc.

Computing tasks discussed herein as being performed at computing device(s) remote from the autonomous vehicle can instead be performed at the autonomous vehicle (e.g., via the vehicle computing system), or vice versa. Such configurations can be implemented without deviating from the scope of the present disclosure. The use of computer-based systems allows for a great variety of possible configurations, combinations, and divisions of tasks and functionality between and among components. Computer-implemented operations can be performed on a single component or across multiple components. Computer-implements tasks and/or operations can be performed sequentially or in parallel. Data and instructions can be stored in a single memory device or across multiple memory devices.

Aspects of the disclosure have been described in terms of illustrative embodiments thereof. Numerous other embodiments, modifications, and/or variations within the scope and spirit of the appended claims can occur to persons of ordinary skill in the art from a review of this disclosure. Any and all features in the following claims can be combined and/or rearranged in any way possible.

While the present subject matter has been described in detail with respect to specific example embodiments thereof, it will be appreciated that those skilled in the art, upon attaining Fan understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A vehicle computing system onboard an autonomous vehicle, the vehicle computing system comprising:
   one or more processors;
   one or more non-transitory computer-readable media that store instructions for execution by the one or more processors to cause the vehicle computing system to perform operations, the operations comprising:

obtaining sensor data from one or more sensors of the autonomous vehicle;

applying lossy compression to the sensor data to generate compressed sensor data;

storing data describing the compressed sensor data;

decompressing the compressed sensor data to generate decompressed sensor data;

providing the compressed sensor data to a remote computing system for logged viewing of the compressed sensor data;

providing the decompressed sensor data to the remote computing system for live viewing of the decompressed sensor data;

inputting data describing the decompressed sensor data into an autonomy system comprising one or more machine-learned models, the autonomy system configured to control operations of the autonomous vehicle based on the decompressed sensor data; and providing a collection of compressed sensor data including the compressed sensor data from the autonomous vehicle and compressed sensor data from other autonomous vehicles as input to the one or more machine-learned models offboard the autonomous vehicles to train the one or more machine-learned models.

2. The vehicle computing system of claim 1, wherein the sensor data comprises image data.

3. The vehicle computing system of claim 2, wherein the operations further comprise, before applying the lossy compression to the sensor data to generate the compressed sensor data, converting the sensor data into a non-linear color space.

4. The vehicle computing system of claim 1, wherein applying the lossy compression to the sensor data to generate the compressed sensor data comprises applying a lossy compression algorithm to individual image frames of the sensor data without applying motion-based compression.

5. The vehicle computing system of claim 1, wherein applying the lossy compression to the sensor data to generate the compressed sensor data comprises applying a block-oriented integer-discrete cosine transform algorithm.

6. The vehicle computing system of claim 1, further comprising a field programmable gate array, and wherein applying the lossy compression to the sensor data to generate the compressed sensor data comprises applying the lossy compression using the field programmable gate array.

7. The vehicle computing system of claim 6, wherein the sensor data comprises raw Bayer data.

8. The vehicle computing system of claim 1, wherein the one or more machine-learned models of the autonomy system were trained using training sensor data that was previously compressed with the lossy compression.

9. The vehicle computing system of claim 8, wherein the training sensor data that was previously compressed with the lossy compression was collected onboard at least one of the autonomous vehicle or another autonomous vehicle.

10. The vehicle computing system of claim 1, wherein applying the lossy compression to the sensor data to generate the compressed sensor data comprises applying an H264 compression codec.

11. A method for compressing and storing sensor data collected by an autonomous vehicle, the method comprising:

obtaining, by a vehicle computing system comprising one or more computing devices onboard the autonomous vehicle, sensor data from by one or more sensors of the autonomous vehicle;

applying, by the vehicle computing system, lossy compression to the sensor data to generate compressed sensor data;

storing, by the vehicle computing system, data describing the compressed sensor data;

decompressing, by the vehicle computing system, the compressed sensor data to generate decompressed sensor data;

providing the compressed sensor data to a remote computing system for logged viewing of the compressed sensor data;

providing the decompressed sensor data to the remote computing system for live viewing of the decompressed sensor data;

inputting, by the vehicle computing system, data describing the decompressed sensor data into an autonomy system comprising one or more machine-learned models, the autonomy system configured to control operations of the autonomous vehicle based on the decompressed sensor data; and providing a collection of compressed sensor data including the compressed sensor data from the autonomous vehicle and compressed sensor data from other autonomous vehicles as input to the one or more machine-learned models offboard the autonomous vehicles to train the one or more machine-learned models.

12. The method of claim 11, wherein the sensor data comprises image data.

13. The method of claim 12, further comprising, before applying the lossy compression to the sensor data to generate the compressed sensor data, converting, by the vehicle computing system, the sensor data into a non-linear color space.

14. The method of claim 12, wherein applying the lossy compression to the sensor data to generate the compressed sensor data comprises applying, by the vehicle computing system, a lossy compression algorithm to individual image frames of the sensor data without applying motion-based compression.

15. The method of claim 12, wherein applying the lossy compression to the sensor data to generate the compressed sensor data comprises applying the lossy compression using a field programmable gate array.

16. The method of claim 11, wherein applying the lossy compression to the sensor data to generate the compressed sensor data comprises applying, by the vehicle computing system, a block-oriented integer-discrete cosine transform algorithm.

17. The method of claim 11, wherein the sensor data comprises raw Bayer data.

18. The method of claim 11, wherein the one or more machine-learned models of the autonomy system were trained using training sensor data that was previously compressed with the lossy compression.

19. The method of claim 18, wherein the training sensor data that was previously compressed onboard one or more of the autonomous vehicle or another autonomous vehicle.

20. A computing system comprising:

a vehicle computing system onboard an autonomous vehicle, the vehicle computing system comprising one or more processors and one or more non-transitory computer-readable media that store instructions for execution by the one or more processors to cause the vehicle computing system to perform operations, the operations comprising:

obtaining sensor data from by one or more sensors of the autonomous vehicle;

applying lossy compression to the sensor data to generate compressed sensor data;
storing data describing the compressed sensor data;
decompressing the compressed sensor data to generate decompressed sensor data;
providing the compressed sensor data to a remote computing system for logged viewing of the compressed sensor data; and
providing the decompressed sensor data to the remote computing system for live viewing of the decompressed sensor data; and a training computing system offboard the autonomous vehicle, the training computing system comprising one or more processors and one or more non-transitory computer-readable media that store instructions that are executable by the one or more processors to cause the training computing system to perform operations, the operations comprising:
receiving a collection of compressed sensor data including the compressed sensor data from the vehicle computing system and compressed sensor data from other autonomous vehicles; and
providing the collection of compressed sensor data as input to one or more machine-learned models to train the one or more machine-learned models.

21. The computing system of claim 20, wherein the sensor data comprises image data.

* * * * *